US010345701B2

(12) United States Patent
Park et al.

(10) Patent No.: US 10,345,701 B2
(45) Date of Patent: Jul. 9, 2019

(54) PHOTORESIST POLYMERS, PHOTORESIST COMPOSITIONS, METHODS OF FORMING PATTERNS AND METHODS OF MANUFACTURING SEMICONDUCTOR DEVICES

(71) Applicants: Jin Park, Yongin-si (KR); Hyun-woo Kim, Seongnam-si (KR); Jin-Kyu Han, Hwaseong-si (KR); Cha-Won Koh, Yongin-si (KR)

(72) Inventors: Jin Park, Yongin-si (KR); Hyun-woo Kim, Seongnam-si (KR); Jin-Kyu Han, Hwaseong-si (KR); Cha-Won Koh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/808,116

(22) Filed: Nov. 9, 2017

(65) Prior Publication Data
US 2018/0069020 A1    Mar. 8, 2018

Related U.S. Application Data

(62) Division of application No. 14/959,601, filed on Dec. 4, 2015, now Pat. No. 9,842,852.

(30) Foreign Application Priority Data

Dec. 12, 2014 (KR) .................. 10-2014-0178949

(51) Int. Cl.
| | | |
|---|---|---|
| G03F 7/004 | (2006.01) | |
| G03F 7/075 | (2006.01) | |
| H01L 21/311 | (2006.01) | |
| H01L 27/11582 | (2017.01) | |
| G03F 7/039 | (2006.01) | |
| H01L 27/1157 | (2017.01) | |
| H01L 27/11575 | (2017.01) | |
| H01L 21/3213 | (2006.01) | |
| H01L 21/768 | (2006.01) | |

(52) U.S. Cl.
CPC .......... *G03F 7/0045* (2013.01); *G03F 7/0046* (2013.01); *G03F 7/0392* (2013.01); *G03F 7/0757* (2013.01); *G03F 7/0758* (2013.01); *H01L 21/31144* (2013.01); *H01L 21/32139* (2013.01); *H01L 27/1157* (2013.01); *H01L 27/11575* (2013.01); *H01L 27/11582* (2013.01); *H01L 21/76802* (2013.01)

(58) Field of Classification Search
CPC ........ G03F 7/033; G03F 7/0758; C08F 20/22; C08F 212/08

USPC .............. 430/270.1, 905, 910; 526/245, 293
See application file for complete search history.

(56) References Cited

U.S. PATENT DOCUMENTS

| | | | |
|---|---|---|---|
| 6,077,643 A | 6/2000 | Kumar et al. | |
| 6,416,939 B1* | 7/2002 | Shimada | G03F 7/0045 430/281.1 |
| 6,492,087 B1 | 12/2002 | Brainard | |
| 6,884,564 B2 | 4/2005 | Feiring et al. | |
| 7,261,993 B2 | 8/2007 | Schadt, III et al. | |
| 7,285,373 B2 | 10/2007 | Lim et al. | |
| 7,300,741 B2 | 11/2007 | Huang et al. | |
| 7,611,821 B2 | 11/2009 | Nishi et al. | |
| 7,679,133 B2 | 3/2010 | Son et al. | |
| 7,887,990 B2* | 2/2011 | Isono | G03F 7/0046 430/270.1 |
| 8,129,080 B2 | 3/2012 | Fonseca et al. | |
| 8,202,677 B2 | 6/2012 | Takeda et al. | |
| 8,273,830 B2 | 9/2012 | Masunaga et al. | |
| 8,383,316 B2 | 2/2013 | Cooper et al. | |
| 8,404,433 B2 | 3/2013 | Okaji | |
| 8,426,108 B2 | 4/2013 | Masunaga et al. | |
| 8,553,466 B2 | 10/2013 | Han et al. | |
| 8,559,235 B2 | 10/2013 | Yoon et al. | |
| 8,628,908 B2 | 1/2014 | Watanabe et al. | |
| 8,632,939 B2 | 1/2014 | Masunaga et al. | |
| 8,654,587 B2 | 2/2014 | Yoon et al. | |
| 8,663,897 B2* | 3/2014 | Masubuchi | C07C 309/12 430/270.1 |
| 8,664,357 B2 | 3/2014 | Livingston et al. | |
| 8,722,321 B2 | 5/2014 | Kobayashi et al. | |
| 8,778,601 B2 | 7/2014 | Kang et al. | |
| 8,815,492 B2 | 8/2014 | Ohsawa et al. | |
| 9,842,852 B2* | 12/2017 | Park | H01L 21/31144 |
| 10,113,022 B2* | 10/2018 | Park | G03F 7/038 |
| 2009/0267239 A1* | 10/2009 | Kanada | G03F 7/022 257/787 |

(Continued)

FOREIGN PATENT DOCUMENTS

| | | |
|---|---|---|
| JP | 2009-040762 A | 2/2009 |
| JP | 4416941 B2 | 2/2010 |
| KR | 2011-0058128 A | 6/2011 |

OTHER PUBLICATIONS

US 8,778,591 B2, 07/2014, Sagehashi et al. (withdrawn)

*Primary Examiner* — John S Chu
(74) *Attorney, Agent, or Firm* — Harness, Dickey & Pierce, P.L.C.

(57) ABSTRACT

A photoresist polymer includes a first repeating unit and a second repeating unit. The first repeating unit includes a fluorine leaving group that is configured to be removed by a photo-chemical reaction. The second repeating unit includes a silicon-containing leaving group that is configured to be removed by the fluorine leaving group when the fluorine leaving group is removed from the first repeating unit.

15 Claims, 26 Drawing Sheets

(56) References Cited

U.S. PATENT DOCUMENTS

| | | |
|---|---|---|
| 2010/0028804 A1 | 2/2010 | Iwato et al. |
| 2011/0123925 A1 | 5/2011 | Yun et al. |
| 2011/0233648 A1 | 9/2011 | Seol et al. |
| 2014/0093823 A1 | 4/2014 | Brainard et al. |
| 2014/0193752 A1 | 7/2014 | Brainard et al. |
| 2014/0242521 A1 | 8/2014 | Ongayi et al. |
| 2014/0329379 A1 | 11/2014 | Kim et al. |

* cited by examiner

PHOTORESIST POLYMERS, PHOTORESIST COMPOSITIONS, METHODS OF FORMING PATTERNS AND METHODS OF MANUFACTURING SEMICONDUCTOR DEVICES

CROSS-REFERENCE TO RELATED APPLICATION

This application is a divisional of U.S. application Ser. No. 14/959,601, filed on Dec. 4, 2015, which claims priority under 35 USC § 119 to Korean Patent Application No. 10-2014-0178949, filed on Dec. 12, 2014 in the Korean Intellectual Property Office (KIPO), the entire contents of each of the above-referenced applications are hereby incorporated by reference.

BACKGROUND

1. Field

Example embodiments relate to photoresist polymers, photoresist compositions, methods of forming patterns and/or methods of manufacturing semiconductor devices. More particularly, example embodiments relate to photoresist polymers including leaving groups, photoresist compositions including the photoresist polymers, methods of forming patterns and/or methods of manufacturing semiconductor devices using the photoresist polymers.

2. Description of Related Art

A photolithography process may be utilized for a formation of various patterns included in a semiconductor device. For example, a photoresist layer may be divided into an exposed portion and a non-exposed portion by, e.g., an exposure process, and the exposed portion may be removed by a developing process to form a photoresist pattern. The object layer may be patterned using the photoresist pattern as an etching mask to form a desired pattern.

However, an intermediate component such as an acid may be generated from the exposure process, and a resolution of the photolithography process may be deteriorated by the intermediate component.

SUMMARY

Example embodiments provide a photoresist polymer having an improved resolution.

Example embodiments provide a photoresist composition including the photoresist polymer.

Example embodiments provide a method of forming a pattern using the photoresist polymer.

Example embodiments provide a method of manufacturing a semiconductor device using the photoresist polymer.

According to example embodiments, a photoresist polymer includes a first repeating unit and a second repeating unit. The first repeating unit includes a fluorine leaving group configured to be removed by a photo-chemical reaction. The second repeating unit includes a silicon-containing leaving group configured to be removed by the fluorine leaving group when the fluorine leaving group is removed from the first repeating unit.

In example embodiments, the silicon-containing leaving group may include silyl ether.

In example embodiments, the silicon-containing leaving group may include trimethylsilyl (TMS), tert-butyldimethylsilyl (TBDMS), triisopropylsilyl (TIPS) and/or tert-butyldiphenylsilyl (TBDPS).

In example embodiments, the second repeating unit may be represented by Chemical Formula 1.

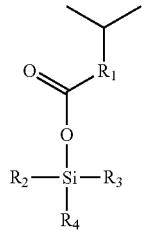

[Chemical Formula 1]

In Chemical Formula 1, $R_1$ may be a divalent group selected from styrene, hydroxystyrene, acrylate, $C_1$-$C_6$ alkylene, arylene, carbonyl, oxy, a $C_2$-$C_{30}$ unsaturated aliphatic group, and a combination thereof. $R_2$, $R_3$ and $R_4$ may be independently hydrogen, a $C_1$-$C_{20}$ alkyl group, a $C_3$-$C_{20}$ cycloalkyl group or a $C_6$-$C_{30}$ aromatic group, and $R_2$, $R_3$ and $R_4$ may be the same as or different from each other.

In example embodiments, the photoresist polymer may be represented by Chemical Formula 2.

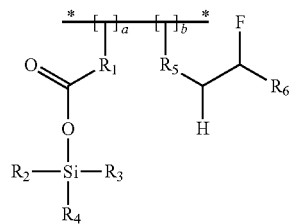

[Chemical Formula 2]

In Chemical Formula 2, $R_1$ and $R_5$ may be each independently a divalent group selected from styrene, hydroxystyrene, acrylate, $C_1$-$C_6$ alkylene, arylene, carbonyl, oxy, a $C_2$-$C_{30}$ unsaturated aliphatic group, and a combination thereof. $R_2$, $R_3$ and $R_4$ may be independently hydrogen, a $C_1$-$C_{20}$ alkyl group, a $C_3$-$C_{20}$ cycloalkyl group or a $C_6$-$C_{30}$ aromatic group, and $R_2$, $R_3$ and $R_4$ may be the same as or different from each other. $R_6$ may be a $C_1$-$C_{20}$ alkyl group, a $C_1$-$C_{20}$ allyl group, a $C_3$-$C_{20}$ cycloalkyl group, a $C_6$-$C_{30}$ aromatic group, a hydroxyl group, a hydroxyalkyl group, or a $C_1$-$C_{20}$ alkoxy group. Each a and b may represent a mole ratio ranging from about 0.4 to about 0.6, and a sum of a and b may be 1.

In example embodiments, in Chemical Formula 2, fluorine (F) and hydrogen (H) may be positioned in a staggered conformation or an anti-periplanar configuration.

According to example embodiments, a photoresist composition includes a photoresist polymer including a repeating unit combined with a silicon-containing leaving group, a fluorine-containing source configured to provide an active fluorine, and a solvent.

In example embodiments, wherein the repeating unit may be represented by the above Chemical Formula 1.

In example embodiments, the fluorine-containing source may include a salt solution of a fluorine ion. The salt solution may be an organic salt solution or an inorganic salt solution.

In example embodiments, the fluorine-containing source may include an ammonium fluoride solution or an alkali metal fluoride solution.

In example embodiments, the fluorine-containing source may be incorporated in the photoresist polymer as a repeating unit thereof.

In example embodiments, the photoresist polymer may be represented by the above Chemical Formula 2.

In example embodiments, the photoresist composition may further include a photoacid generator and/or a sensitizer.

According to example embodiments, a method of forming a pattern includes forming a photoresist layer on an object layer, performing an exposure process on the photoresist layer, and forming a photoresist pattern. The photoresist layer includes photoresist polymer that includes a first repeating unit and a second repeating unit. The first repeating unit includes a fluorine leaving group and the second repeating unit includes a silicon-containing leaving group. The exposure process induces a reaction between the fluorine leaving group and the silicon-containing leaving group. The forming a photoresist pattern includes removing an exposed portion of the photoresist layer.

In example embodiments, the performing the exposure process may include inducing an elimination reaction may in the first repeating unit so that the fluorine leaving group may be separated from the first repeating unit.

In example embodiments, the performing the exposure process may include increasing a degree of unsaturation at the exposed portion by the exposure process.

In example embodiments, the reaction induced by the performing the exposure process may include separating the fluorine leaving group from the first repeating unit and transferring the separated fluorine leaving group to the second repeating unit to attack the silicon-containing leaving group.

In example embodiments, the exposed portion may be more hydrophilic and polar than a non-exposed portion of the photoresist layer after the performing the exposure process.

In example embodiments, the reaction induced by the performing the exposure process may include removing the silicon-containing leaving group from the exposed portion so that a hydroxyl group or a carboxylic group may be created in the exposed portion.

In example embodiments, the removing the exposed portion of the photoresist layer may include performing a developing process or a dry etching process.

In example embodiments, the photoresist polymer may be represented by the above Chemical Formula 2.

In example embodiments, the object layer may be patterned using the photoresist pattern as an etching mask.

According to example embodiments, a method of forming a pattern includes forming a photoresist layer on an object layer by coating a photoresist composition on the object layer, performing an exposure process on the photoresist layer, and removing an exposed portion of the photoresist layer to form a photoresist pattern. The photoresist composition includes a photoresist polymer, a fluorine-containing source configured to provide an active fluorine and a solvent. The photoresist polymer includes a repeating unit combined with a silicon-containing leaving group. The exposure process performed on the photoresist layer transfers the active fluorine from the fluorine-containing source to the silicon-containing leaving group.

In example embodiments, the active fluorine may include one of a fluorine ion and a fluorine radical.

In example embodiments, the photoresist composition may further include a photoacid generator and/or a sensitizer.

In example embodiments, the fluorine-containing source may be provided as a fluorine ion salt, or incorporated in the photoresist polymer as a repeating unit thereof.

In example embodiments, the performing the exposure process may include inducing a reaction that combines the active fluorine may with the silicon-containing leaving group, and removing the active fluorine combined with the silicon-containing leaving group from the photoresist polymer.

According to example embodiments, a method of manufacturing a semiconductor device includes forming a mold structure by alternately and repeatedly stacking insulating interlayers and sacrificial layers on a substrate, forming a photoresist layer on the mold structure by coating a photoresist composition that includes a photoresist polymer on the mold structure, performing an exposure process on a lateral portion of the photoresist layer to form an exposed portion in the photoresist layer, removing the exposed portion to form a photoresist pattern, partially removing a lateral portion of the mold structure using the photoresist pattern as an etching mask, forming a plurality of vertical channels through a central portion of the mold structure, and replacing the sacrificial layers with gate lines. The photoresist composition includes a fluorine-containing source configured to provide an active fluorine and solvent. The photoresist polymer includes a repeating unit combined with a silicon-containing leaving group.

In example embodiments, the method may further include converting the mold structure into a stepped mold structure by repeatedly performing the performing the exposure process on the lateral portion of the photoresist layer, the removing the exposed portion to form the photoresist pattern, and the partially removing the lateral portion of the mold structure.

In example embodiments, the performing the exposure process may include a chemical reaction that removes the silicon-containing leaving group from the exposed portion, and the exposed portion may be at least one of more hydrophilic and more polar than a non-exposed portion of the photoresist layer after the silicon-containing leaving group is removed from the exposed portion.

According to example embodiments, a method of forming a pattern includes: forming a photoresist layer on an object layer, the photoresist layer including a photoresist polymer includes a repeating unit that includes a silicon-containing leaving group, the photoresist layer including a fluorine source configured to provide active fluorine in response to exposure from light; performing an exposure process on the photoresist layer to separate the active fluorine from the fluorine source, the performing the exposure process including inducing a reaction between the active fluorine and the silicon-containing leaving group that removes the silicon-containing leaving group from the photoresist polymer; and forming a photoresist pattern by removing an exposed portion of the photoresist layer.

In example embodiments, the photoresist polymer may include a first repeating unit that includes a fluorine leaving group configured to be removed by the exposure process. The fluorine leaving group may be the fluorine source. The repeating unit that includes the silicon-containing leaving group may be a second repeating unit.

In example embodiments, the fluorine source may include a salt solution of a fluorine ion.

In example embodiments, the repeating unit may include one of silyl ether and a functional group represented by the above Chemical Formula 1.

In example embodiments, a semiconductor device may be manufactured by forming a mold structure by alternately and repeatedly stacking insulating interlayers and sacrificial layers on a substrate, performing the above method of forming a pattern to form a photoresist pattern on the mold structure, removing the portion of the mold structure using the photoresist pattern as an etching mask, forming a plurality of vertical channels through a central portion of the mold structure, replacing the sacrificial layers with gate lines.

BRIEF DESCRIPTION OF THE DRAWINGS

Example embodiments will be more clearly understood from the following detailed description taken in conjunction with the accompanying drawings.

FIGS. 1 to 6 are cross-sectional views illustrating a method of forming a pattern in accordance with example embodiments;

FIGS. 7 to 14 are cross-sectional views illustrating a method of forming a pattern in accordance with example embodiments; and FIGS. 15 to 33 are top plan views and cross-sectional views illustrating a method of manufacturing a semiconductor device in accordance with example embodiments.

DESCRIPTION OF EXAMPLE EMBODIMENTS

Figure 1:
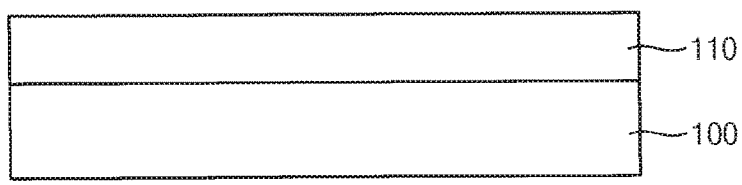
FIGS. 1 to 33 represent non-limiting, example embodiments as described herein.

Various example embodiments will be described more fully hereinafter with reference to the accompanying drawings, in which some example embodiments are shown. Inventive concepts may, however, be embodied in many different forms and should not be construed as limited to the embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Photoresist Polymers

A photoresist polymer in accordance with example embodiments may include a first repeating unit and a second repeating unit that may be alternately and repeatedly propagated in a backbone chain.

The backbone chain may include a carbon chain included in a photoresist material. For example, the backbone chain may include a polymer chain such as novolak, polystyrene, polyhydroxystyrene (PHS), polyacrylate, polymethacrylate, polyvinyl ester, polyvinyl ether, polyolefin, polynorbornene, polyester, polyamide, polycarbonate or the like. In example embodiments, novolak, polystyrene, PHS or polyacrylate may be used as the backbone chain.

The first repeating unit may include a halogen leaving group. For example, the first repeating unit may include a fluorine leaving group. In example embodiments, the fluorine leaving group may be configured to be removed or separated from the first repeating unit by a photo-chemical reaction induced by, e.g., an ultraviolet (UV) exposure process. In example embodiments, the fluorine leaving group may be removed in a form of hydrogen fluoride (HF) from the first repeating unit.

The second repeating unit may include a leaving group that is configured to (and/or capable of) being reacted with the fluorine leaving group separated from the first repeating unit and configured to (and/or capable of) being removed from the second repeating unit. In example embodiments, the second repeating unit may include a silicon-containing leaving group.

In example embodiments, the silicon-containing leaving group may include silyl ether. For example, the silicon-containing leaving group may include trimethylsilyl (TMS), tert-butyldimethylsilyl (TBDMS), triisopropylsilyl (TIPS), tert-butyldiphenylsilyl (TBDPS) or a combination thereof.

For example, the second repeating unit including the silicon-containing leaving group may be represented by the following Chemical Formula 1.

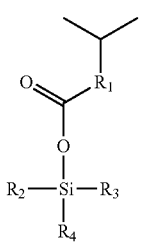

[Chemical Formula 1]

In Chemical Formula 1, $R_1$ may be a divalent group selected styrene, hydroxystyrene, acrylate, $C_1$-$C_6$ alkylene, arylene, carbonyl, oxy, a C2-C30 unsaturated aliphatic group or a combination thereof. R2, R3 and R4 may be independently hydrogen, a C1-C20 alkyl group, a C3-C20 cycloalkyl group or a C6-C30 aromatic group. R2, R3 and R4 may be the same as or different from each other.

In example embodiments, the photoresist polymer may be represented by the following Chemical Formula 2.

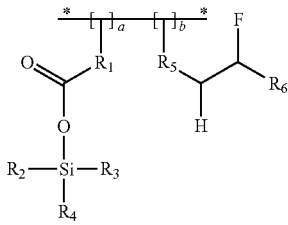

[Chemical Formula 2]

In Chemical Formula 2, a right repeating unit denoted as "b" may correspond to the first repeating unit, and a left repeating unit denoted as "a" may correspond to the second repeating unit.

R1 to R4 may be substantially the same as those defined in the above Chemical Formula 1. R5 may be a divalent group selected styrene, hydroxystyrene, acrylate, C1-C6 alkylene, arylene, carbonyl, oxy, a C2-C30 unsaturated aliphatic group or a combination thereof, similarly to R1. R6 may be a C1-C20 alkyl group, a C1-C20 allyl group, a C3-C20 cycloalkyl group, a C6-C30 aromatic group, a hydroxyl group, a hydroxyalkyl group, or a C1-C20 alkoxy group. Each a and b may represent a mole ratio. In example embodiments, each a and b may range from about 0.4 to about 0.6, and a sum of a and b may be 1.

In example embodiments, the first and second repeating units may be alternately repeated in the backbone chain. In this case, the first and second repeating units may be combined by a ratio of 1:1 to form one polymerized repeating unit, and the polymerized repeating units may be repeated in the backbone chain.

In this case, the photoresist polymer may be represented by the following Chemical Formula 3.

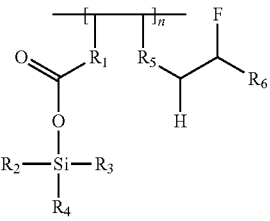

[Chemical Formula 3]

For example, in Chemical Formulas, n may be an integer ranging from about 10 to about 10,000.

In the above Chemical Formula 3, a hydrogen atom and a fluorine atom included in the first repeating unit may be positioned in a configuration for facilitating an elimination reaction photo-chemically induced. For example, the hydrogen atom and the fluorine atom may be positioned in a staggered conformation or a trans configuration. In example embodiments, the hydrogen atom and the fluorine atom may be positioned in an anti-periplanar configuration.

Accordingly, the elimination reaction may occur through the exposure process using, e.g., an extreme ultraviolet (EUV) light source so that HF may be removed. As a result, a double bond may be created in the first repeating unit so that a degree of unsaturation therein may be increased.

The fluorine atom removed from the first repeating unit may be converted to an active fluorine such as a fluorine ion (F—) or a fluorine radical (F.) to attack a silicon atom of the second repeating unit. Thus, the silicon-containing leaving group may be removed from the second repeating unit, and a hydroxyl group or carboxylic acid may be combined at a position from which the silicon-containing leaving group is departed. Therefore, a portion of the photoresist polymer from which the leaving groups are separated may have improved hydrophilicity and etching rate.

In example embodiments, the photoresist polymer may serve as a positive-type photoresist material. In this case, a portion of the photoresist polymer exposed to light (e.g., exposed portion) may be removed by an etching process or a developing process. The portion of the photoresist polymer that is not exposed to light (e.g., non-exposed portion) may remain after the exposed portion is removed by the etching process or the developing process.

Photoresist Compositions

A photoresist composition according to example embodiments may include a photoresist polymer that may include a repeating unit to which a silicon-containing leaving group may be combined, a fluorine-containing source providing an active fluorine and a solvent.

The silicon-containing leaving group may include silyl ether such as TMS, TBDMS, TIPS or TBDPS. In this case, the repeating unit including the silicon-containing leaving group may be represented by the above Chemical Formula 1.

In example embodiments, the fluorine-containing source may be incorporated in the photoresist polymer as a repeating unit thereof. In this case, the photoresist polymer may be polymer of a first repeating unit including a fluorine leaving group and a second repeating unit including the silicon-containing leaving group as described above.

In example embodiments, the photoresist polymer may be represented by the above Chemical Formula 2. In example embodiments, the photoresist polymer may be represented by the above Chemical Formula 3.

In example embodiments, the fluorine-containing source may include an organic salt solution or an inorganic salt solution of a fluorine ion. For example, the organic salt solution of the fluorine ion may include an organic fluoride ammonium salt such as tetrabutylammonium fluoride (TBAF). The inorganic salt solution of the fluorine ion may include fluoride ammonium (NH4F), or an alkali metal fluoride such as KF, NaF, CsF, etc.

The organic salt or the inorganic salt of the fluorine ion may be co-present with the photoresist polymer so that the fluorine ion may be created from the fluorine-containing source during an exposure process to attack a silicon atom of the silicon-containing leaving group. Thus, the silicon-containing leaving group may be removed from the repeating unit of the photoresist polymer.

The solvent may include an organic solvent having a good solubility for a polymer material, and a good coatability (e.g., good coating characteristics) for a formation of a uniform photoresist layer. Examples of the solvent may include cyclohexanone, cyclopentanone, tetrahydrofuran (THF), dimethylformamide, propylene glycol monomethyl ether acetate (PGMEA), ethyl lactate, methyl ethyl ketone, benzene or toluene. These may be used alone or in a combination thereof.

In example embodiments, if the fluorine-containing source is provided as the organic salt solution or the inorganic salt solution, a phase separation between the solution and the solvent may occur. Thus, a surfactant may be added in the composition so that a contact and/or a reaction between the fluorine-containing source and the photoresist polymer may be facilitated. The surfactant may include, e.g., a sorbitol-based agent or an alcohol having a relatively long carbon chain.

In example embodiments, the photoresist composition may further include a photoacid generator (PAG). The PAG may include any compounds capable of generating an acid by an exposure process. For example, the PAG may include an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine, N-hydroxysuccinimide triflate, or the like. These may be used alone or in a combination thereof.

The acid (e.g., proton (H+)) generated from the PAG may serve as a catalyst facilitating a fluorine removal from the polymer represented by the above Chemical Formula 2 or Chemical Formula 3. For example, while performing a photo-chemical reaction by the exposure process, some of the first repeating units in an exposed portion may remain in a state that the fluorine leaving group may not be removed. The fluorine leaving groups included in the some of the first repeating units may be removed by the acid from the PAG.

If the PAG is excessively included in the photoresist composition, defects of a photoresist pattern may be caused by an acid diffusion. Thus, the PAG may be added in the photoresist composition only by a catalytic amount.

In example embodiments, the photoresist composition may further include a sensitizer for facilitating the photo-chemical reaction. An amount of photons may be amplified by the sensitizer, and thus a sufficient amount of the active fluorine may be obtained.

The sensitizer may include, e.g., benzophenone, benzoyl, thiophene, naphthalene, anthracene, phenanthrene, pyrene, coumarin, thioxantone, acetophenone, naphtoquinone, anthraquinone, or the like. These may be used alone or in a combination thereof.

The photoresist composition may further include an additive for improving chemical and physical properties of a photoresist layer formed from the composition. The additive may include, e.g., a leveling agent, a viscosity modifier, or the like.

The photoresist composition may be a positive-type. For example, when the exposure process may be performed on the photoresist layer formed from the composition, the active fluorine including a fluorine ion or a fluorine radical may be generated from the fluorine-containing source at an exposed portion. The silicon-containing leaving group of the photoresist polymer may be removed by the active fluorine. A hydroxyl group or carboxylic acid may be created at a site from which the silicon-containing leaving group is removed. Thus, the exposed portion may have a hydrophilicity and/or a solubility greater than those of a non-exposed portion. Accordingly, the exposed portion may be selectively removed by an etching process or a developing process to form a photoresist pattern.

Method of Forming Patterns

FIGS. 1 to 6 are cross-sectional views illustrating a method of forming a pattern in accordance with example embodiments. For example, FIGS. 1 to 6 illustrate the method of forming patterns utilizing the above-mentioned photoresist polymer or photoresist composition.

Referring to FIG. 1, an object layer 110 may be formed on a substrate 100. The substrate 100 may include a semiconductor substrate or a semiconductor-on-insulator substrate. For example, the substrate 100 may include silicon substrate, a germanium substrate, a silicon-germanium substrate, a silicon-on-insulator (SOI) substrate or a germanium-on-insulator (GOI) substrate. In example embodiments, the substrate 100 may include a group III-V compound such as GaP, GaAs or GaSb.

An image may be transferred from a photoresist pattern to the object layer 110 so that the object layer 110 may be converted to a desired (and/or alternatively predetermined) pattern. In example embodiments, the object layer 110 may be formed of an insulative material such as silicon oxide, silicon nitride or silicon oxynitride. In example embodiments, the object layer 110 may be formed of a conductive material such as a metal, a metal nitride, a metal silicide or a metal silicide nitride. In example embodiments, the object layer 110 may be formed of a semiconductor material such as polysilicon.

The object layer 110 may be formed by at least one deposition process. For example, the objection layer 100 may be formed using at least one of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD) process, and a physical vapor deposition (PVD) process.

Figure 2:
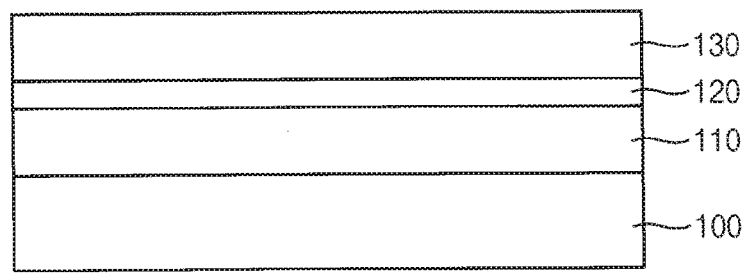

Referring to FIG. 2, an anti-reflective layer 120 and a photoresist layer 130 may be sequentially formed on the object layer 110.

The anti-reflective layer 120 may be formed using an aromatic organic composition such as a phenol resin or a novolak resin, or an inorganic material such as silicon oxynitride. The anti-reflective layer 120 may be formed by a coating process (e.g., a spin coating process, a dip coating process or a spray coating process). The anti-reflective layer 120 may also serve as a planarization layer. In example embodiments, the formation of the anti-reflective layer 120 may be omitted.

The photoresist layer 130 may be formed using the photoresist composition according to example embodiments. As described above, the photoresist composition may include a photoresist polymer that may include a repeating unit to which a silicon-containing leaving group may be combined, a fluorine-containing source providing an active fluorine, and a solvent. The photoresist composition may optionally include a surfactant, a PAG and/or a sensitizer.

In example embodiments, the fluorine-containing source may be incorporated in the photoresist polymer. In this case, the photoresist polymer may be a polymer from a first repeating unit including a fluorine leaving group, and a second repeating unit including the silicon-containing leaving group In example embodiments, the photoresist polymer may be represented by the above Chemical Formula 2 or Chemical Formula 3.

In example embodiments, the fluorine-containing source may be provided as an organic salt solution or an inorganic salt solution of a fluorine ion.

The photoresist layer 130 may be formed by, e.g., a spin coating process, a dip coating process or a spray coating process. In example embodiments, the photoresist composition may be coated to form a preliminary photoresist layer, and the preliminary photoresist layer may be cured by, e.g., a baking process to form the photoresist layer 130.

Figure 3:
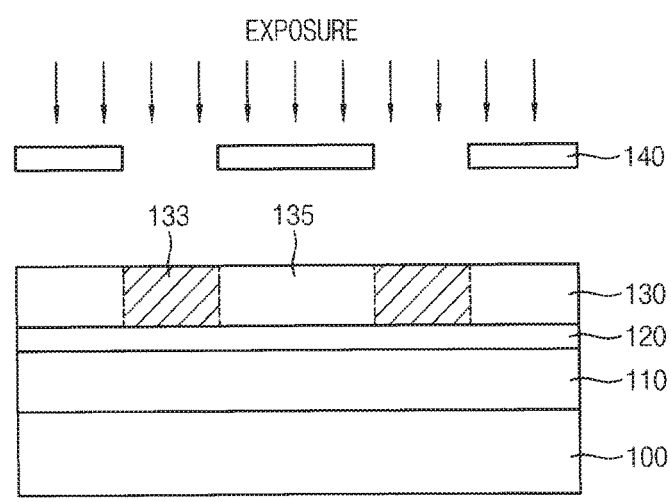

Referring to FIG. 3, an exposure process may be performed on the photoresist layer 130.

In example embodiments, an exposure mask 140 may be placed on the photoresist layer 130, and a light may be irradiated through an opening or a transmission portion included in the exposure mask 140. Non-limiting examples of a light source used in the exposure process may include ArF, KrF, an electron beam, I-line or EUV.

The photoresist layer 130 may be divided into an exposed portion 133 and a non-exposed portion 135. In example embodiments, a chemical structure in the exposed portion 133 may be modified through a mechanism shown by the following Reaction Scheme 1.

For example, according to Reaction Scheme 1, the fluorine-containing source may be incorporated in the photoresist polymer as the first repeating unit, and the silicon-containing leaving group of the second repeating unit may include TBDPS.

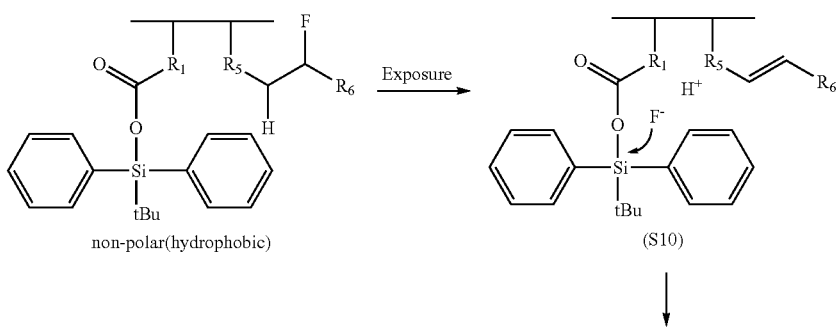

[Reaction Scheme 1]

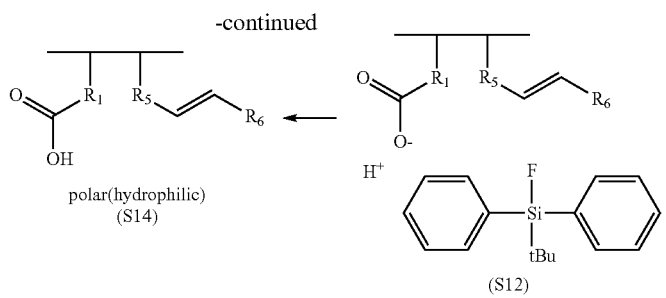

polar(hydrophilic)
(S14)

(S12)

Referring to Reaction Scheme 1, the photoresist layer 130 may be substantially non-polar and/or hydrophobic before the exposure process. In an operation S10, as illustrated in FIG. 3, when the exposure process is initiated, photons may be generated so that fluorine may be separated from the first repeating unit. In example embodiments, the photoresist composition may include the sensitizer. Accordingly, an amount or the number of the photons generated by the exposure process may be increased.

Fluorine (F) and hydrogen (H) in the first repeating unit may be positioned in a trans or anti-periplanar configuration. Thus, an elimination reaction of fluorine and hydrogen may be easily induced by the photons. Accordingly, a double bond may be created in the first repeating unit of the exposed portion 133 so that a degree of unsaturation may be increased, and a fluorine ion (F—) may be generated as the active fluorine. In example embodiments, a fluorine radical may be generated by the photons, and proton (H+) may be also generated by the elimination reaction.

The fluorine ion generated in the operation S10 may be transferred to the second repeating unit to attack a silicon atom of the silicon-containing leaving group.

Accordingly, in an operation S12, the silicon-containing leaving group may be combined with the fluorine ion to be removed from the second repeating unit or the photoresist polymer. For example, a carboxylate ion may be created in the second repeating unit from which the silicon-containing group is departed.

In an operation S14, the carboxylate ion created in the second repeating unit, and the proton created in the operation S10 may be combined so that. e.g., carboxylic acid may be created. Thus, the exposed portion 133 may become more polar and/or hydrophilic than the non-exposed portion 135.

In example embodiments, e.g., if the photoresist polymer has a structure of the above Chemical Formula 3, the fluorine leaving group included in the first repeating unit and the silicon-containing leaving group included in the second repeating unit may be substantially reacted by a ratio of 1:1. Thus, the exposed portion 133 and the non-exposed portion 135 may be formed in a desired resolution by the exposure process without an assistance of the PAG.

In example embodiments, the photoresist composition may include a catalytic amount of the PAG. If the fluorine leaving groups of the first repeating units are not completely removed by the exposure process, remaining fluorine leaving groups may be removed from the first repeating unit by an acid (proton) from the PAG. Therefore, a conversion of the exposed portion 133 into a polar pattern and/or a hydrophilic pattern may be ensured.

Figure 4:
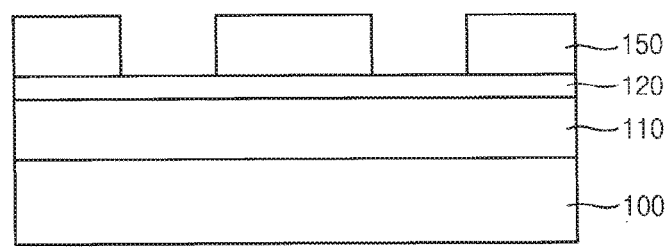

Referring to FIG. 4, the exposed portion 133 of the photoresist layer 130 may be selectively removed by, e.g., a developing process. Accordingly, a photoresist pattern 150 may be defined by the non-exposed portion 135 remaining on the object layer 110 or the anti-reflective layer 120.

In example embodiments, the exposed portion 133 may also be removed by a dry etching process or alternatively be removed using a dry etching process. The dry etching process may include a plasma etching process or a reactive ion etching (RIE) process using, e.g., an oxygen gas.

The exposed portion 133, as described above, may include a highly hydrophilic and/or polar group such as carboxylic acid. Thus, the exposed portion 133 may have a relatively high affinity for the plasma etching process or the RIE process. Therefore, the exposed portion 133 may be selectively removed with a high etching selectivity relative to the non-exposed portion 135.

In example embodiments, the exposed portion 133 may be removed by the developing process. For example, an alcohol-based solution or a hydroxide-based solution such as tetra methyl ammonium hydroxide (TMAH) may be used as the developing solution. As described above, the exposed portion 133 may be converted to a pattern which may be remarkably polar or hydrophilic relatively to the non-exposed portion 135. Therefore, the exposed portion 133 may have a high solubility for the developing solution relatively to the non-exposed portion 135, and thus may be selectively removed by the developing solution such as TMAH.

In a comparative example, while performing an exposure process in which a chemically amplified resist (CAR) system using a PAG is implemented, an acid may be diffused into the non-exposed portion 135 to increase a surface roughness of the photoresist pattern 150. The non-exposed portion 135 may be also damaged by the acid, and thus the photoresist pattern 150 having desired width and/or pitch may not be obtained. As a critical dimension of the photoresist pattern 150 or a target pattern formed by a photolithography process is decreased, a pattern damage by the acid diffusion may be exacerbated.

In example embodiments, the acid from the PAG may be excluded, or may be used only by the catalytic amount. Thus, polar and/or hydrophilic properties of the exposed portion 133 may be achieved substantially only by a reaction between the active fluorine and the silicon-containing leaving group. Therefore, a photolithography process system which may be substantially free of the pattern damage caused by an irregular acid diffusion may be realized. Further, the photoresist pattern 150 and the target pattern having desired fine width and/or pitch may be precisely formed.

Figure 5:
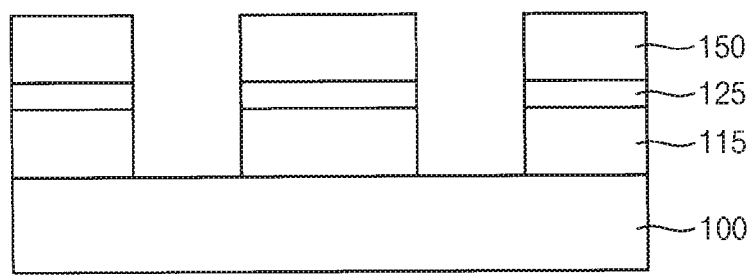

Referring to FIG. 5, the anti-reflective layer 120 and the object layer 110 may be etched using the photoresist pattern 150 as an etching mask. Accordingly, an anti-reflective layer pattern 125 and an object layer pattern 115 may be formed between the photoresist pattern 150 and the substrate 100.

The etching process may include a dry etching process and/or a wet etching process properly selected in consideration of an etching selectivity between the photoresist pattern 150 and the object layer 110.

In example embodiments, the dry etching process may include a plasma etching process.

In example embodiments, when performing the wet etching process, a proper etchant solution such as fluoric acid, phosphoric acid, sulfuric acid or peroxide may be selected depending on a material included in the object layer 110.

Figure 6:
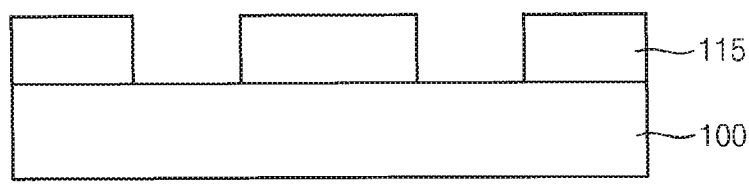

Referring to FIG. 6, the photoresist pattern 150 and the anti-reflective layer pattern 125 may be removed such that the object layer pattern 115 may remain on the substrate 100.

In example embodiments, the photoresist pattern 150 and the anti-reflective layer pattern 125 may be removed by an ashing process and/or a strip process. In example embodiments, the photoresist pattern 150 and the anti-reflective layer pattern 125 may be removed by a planarization process, e.g., a chemical mechanical polish (CMP) process.

If the object layer 110 includes a conductive material, the object layer pattern 115 may serve as a wiring, a contact, a pad, a plug, an interconnection structure, or the like of a semiconductor device.

If the object layer 110 includes an insulative material, the object layer pattern 115 may serve as a desired (and/or alternatively predetermined) insulation pattern, e.g., an insulating interlayer pattern, a filling insulation pattern, or the like. In example embodiments, a portion of the object layer 110 removed by the above-mentioned photolithography process may be converted into a contact hole, an opening or a trench included in the insulation pattern.

FIGS. 7 to 14 are cross-sectional views illustrating a method of forming a pattern in accordance with example embodiments. For example, FIGS. 7 to 14 illustrate a method of forming a conductive pattern utilizing the above-mentioned photoresist polymer or the photoresist composition.

Detailed descriptions on processes and/or materials substantially the same as or similar to those illustrated with reference to FIGS. 1 to 6 are omitted herein.

Figure 7:
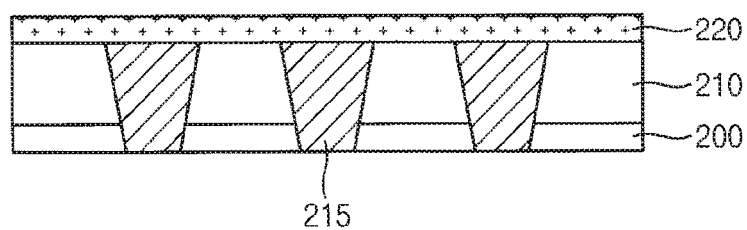

Referring to FIG. 7, a lower contact 215 extending through a lower insulation layer 210 may be formed. A plurality of the lower contacts 215 may be formed in the lower insulation layer 210.

In example embodiments, the lower insulation layer 210 may be formed on a passivation layer 200, and a contact hole extending through the lower insulation layer 210 and the passivation layer 200 may be formed. The lower contact 215 may be formed by filling a conductive layer in the contact hole by a deposition process or a plating process.

In example embodiments, the method of forming patterns in accordance with example embodiments as described above may be implemented for the formation of the contact hole using the lower insulation layer 210 as an object layer.

The lower insulation layer 210 may be formed of an insulative material such as silicon oxide or silicon oxynitride. For example, the lower insulation layer 210 may be formed of a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The passivation layer 200 may be formed of silicon nitride. The conductive layer may be formed of a metal such as aluminum (Al), tungsten (W) or copper (Cu), or a metal nitride.

In example embodiments, the lower contact 215 may be electrically connected to a circuit device or a lower wiring formed on a semiconductor substrate. Damages of the circuit device or the lower wiring while forming the contact hole may be limited and/or prevented by the passivation layer 200.

A first etch-stop layer 220 may be formed on the lower insulation layer 210 to cover the lower contacts 215. The first etch-stop layer 220 may be formed of silicon nitride or silicon oxynitride. For example, the first etch-stop layer 220 may be formed by, e.g., a CVD process, a PECVD process, a spin coating process or an ALD process.

Figure 8:
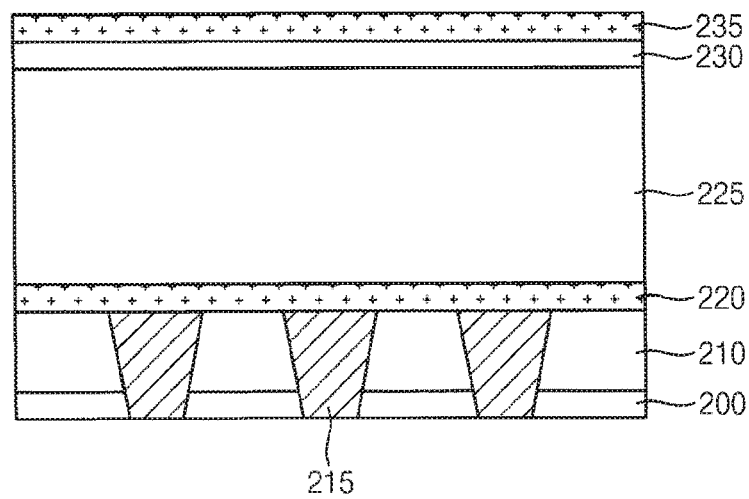

Referring to FIG. 8, an insulating interlayer 225, a buffer layer 230 and a second etch-stop layer 235 may be sequentially formed on the first etch-stop layer 220.

For example, the insulating interlayer 225 may be formed of the above-mentioned silicon oxide-based material, or a polysiloxane-based material. The buffer layer 230 and the second etch-stop layer 235 may be formed of, e.g., silicon oxynitride and silicon nitride, respectively. A stress generated from the second etch-stop layer 235 may be alleviated or absorbed by the buffer layer 230.

The insulating interlayer 225, the buffer layer 230 and the second etch-stop layer 235 may be formed by a deposition process such as a CVD process, a PECVD process, a sputtering process such as an ion beam sputtering process, a spin coating process, or the like.

Figure 9:
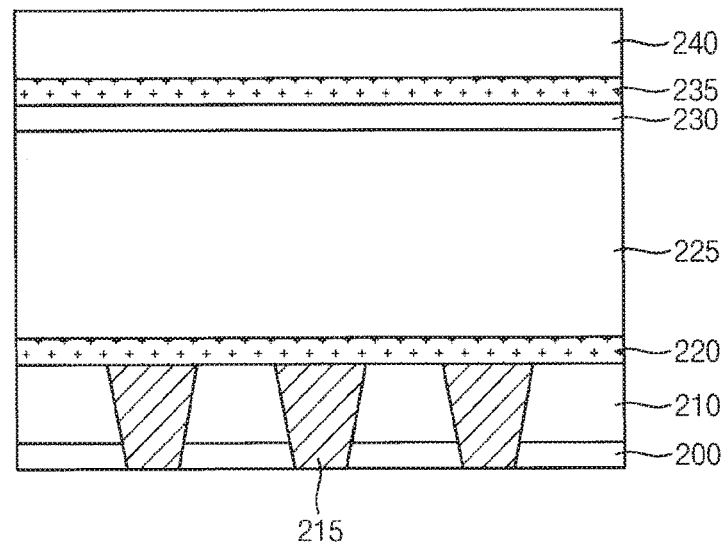

Referring to FIG. 9, a photoresist layer 240 may be formed on the second etch-stop layer 235.

The photoresist layer 240 may be formed using the photoresist composition according to example embodiments. As described above, the photoresist composition may include a photoresist polymer that may include a repeating unit to which a silicon-containing leaving group may be combined, a fluorine-containing source providing an active fluorine, and a solvent. The photoresist composition may optionally include a surfactant, a PAG and/or a sensitizer.

In example embodiments, the fluorine-containing source may be incorporated in the photoresist polymer. In this case, the photoresist polymer may be a polymer from a first repeating unit including a fluorine leaving group, and a second repeating unit including the silicon-containing leaving group.

In example embodiments, the photoresist polymer may be represented by the above Chemical Formula 2 or Chemical Formula 3.

In example embodiments, the fluorine-containing source may be provided as an organic salt solution or an inorganic salt solution of a fluorine ion.

In example embodiments, the photoresist composition may be coated to form a preliminary photoresist layer, and the preliminary photoresist layer may be cured by, e.g., a baking process to form the photoresist layer 240.

Figure 10:
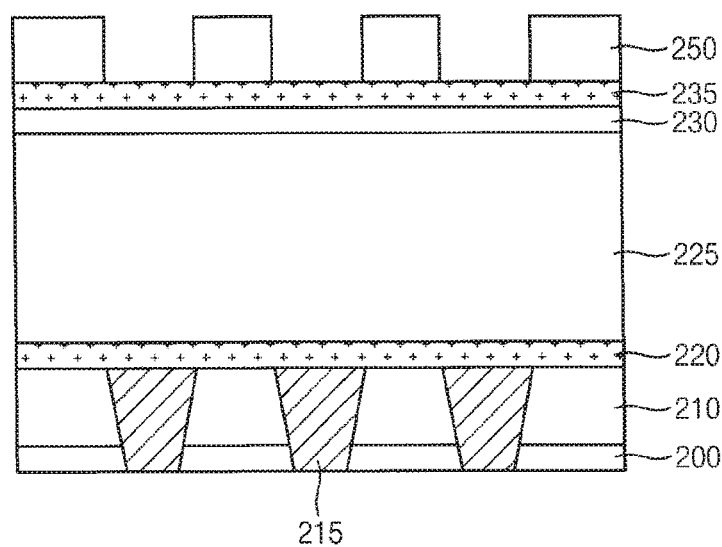

Referring to FIG. 10, processes substantially the same as or similar to those illustrated with reference to FIGS. 3 and 4 may be performed to form a photoresist pattern 250.

In example embodiments, an exposure process may be performed so that an active fluorine including a fluorine ion or a fluorine radical may be generated from the fluorine-containing source included in an exposed portion. The active fluorine may be transferred to the silicon-containing leaving group. Accordingly, a photo-chemical reaction between the first and second repeating units may be induced by, e.g., a mechanism as shown in Reaction Scheme 1, so that a hydrophilicity and/or a polarity of the exposed portion may be remarkably increased relatively to a non-exposed portion.

In example embodiments, the buffer layer 230 may serve as an anti-reflective layer during the exposure process.

The exposed portion may be selectively removed by a developing process or a dry etching process such that the photoresist pattern 250 may be formed.

Figure 11:
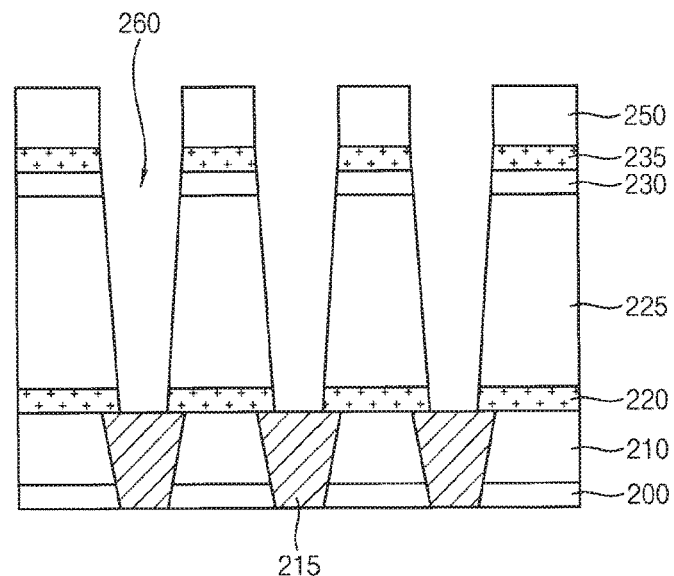

Referring to FIG. 11, the second etch-stop layer 235, the buffer layer 230, the insulating interlayer 225 and the first etch-stop layer 220 may be partially and sequentially etched using the photoresist pattern 250 as an etching mask. Thus, an opening 260 through which the lower contact 215 may be exposed may be formed.

The opening 260 may be formed by a dry etching process. The opening 260 may extend through the insulating interlayer 225 and the first etch-stop layer 220, and may at least partially expose an upper surface of the lower contact 215.

In example embodiments, the opening 260 may have a contact hole shape through which each lower contact 215 may be exposed. In example embodiments, the opening 260 may have a linear shape through which a plurality of the lower contacts 215 may be exposed.

Figure 12:
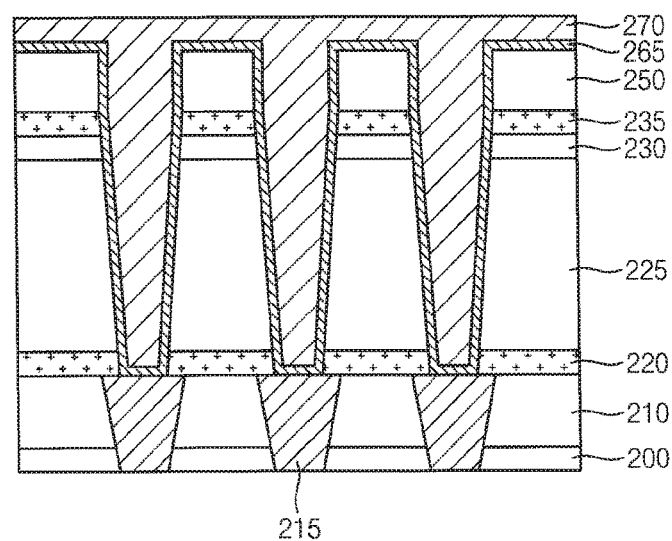

Referring to FIG. 12, a conductive layer 270 filling the openings 260 may be formed.

In example embodiments, a barrier layer 265 may be formed conformally along top surfaces and sidewalls of the photoresist pattern 250, and sidewalls and bottoms of the openings 260. The conductive layer 270 may be formed on the barrier layer 265 to sufficiently fill the openings 260.

The barrier layer 265 may be formed of a metal nitride such as titanium nitride, tantalum nitride or tungsten nitride. The barrier layer 265 may limit and/or prevent a metal ingredient in the conductive layer 270 from being diffused into the insulating interlayer 225. The barrier layer 265 may also provide an adhesion for the formation of the conductive layer 270. The barrier layer 265 may be formed by, e.g., a sputtering process or an ALD process.

The conductive layer 270 may be formed by, e.g., an electroplating process. In this case, a seed layer may be formed conformally on the barrier layer 265 by a sputtering process using a copper target. A plating solution such as a copper sulfate solution may be prepared, and a current may be applied using the seed layer and the plating solution as a cathode and an anode, respectively. Thus, the conductive layer 270 including copper may be grown or precipitated on the seed layer through an electrochemical reaction.

In example embodiments, the conductive layer 270 may be deposited by a sputtering process using a metal target such as copper, tungsten or aluminum, or an ALD process.

Figure 13:
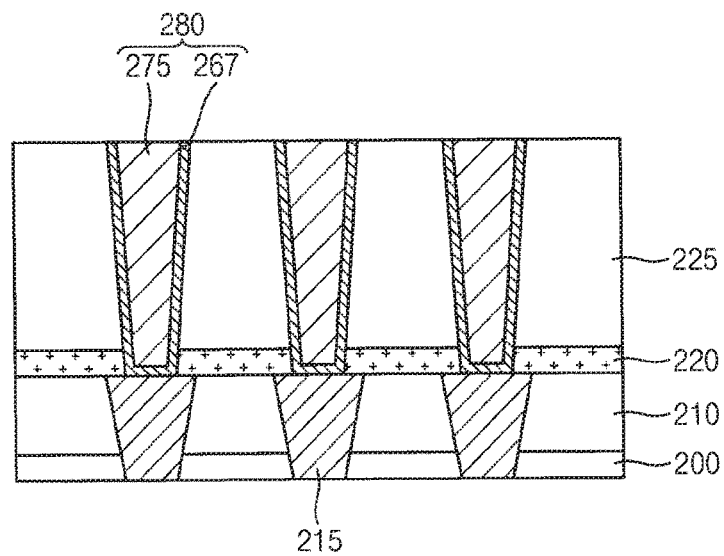

Referring to FIG. 13, upper portions of the conductive layer 270 and the barrier layer 265 may be planarized to form a conductive pattern 280.

In example embodiments, the upper portions of the conductive layer 270 and the barrier layer 265 may be planarized by a CMP process until a top surface of the insulating interlayer 225 is exposed. The photoresist pattern 250, the second etch-stop layer 235 and the buffer layer 230 may be also removed by the planarization process.

Accordingly, the conductive pattern 280 electrically connected to the lower contact 215 may be formed in the opening 260. The conductive pattern 280 may include a barrier layer pattern 267 formed on the sidewall and the bottom of the opening 260, and a conductive layer pattern 275 filling a remaining portion of the opening 260 on the barrier layer pattern 267.

FIGS. 12 and 13 illustrate that the photoresist pattern 250 is removed by the planarization process for the formation of the conductive pattern 280. However, the photoresist pattern 250 may be removed after forming the opening 260 and before forming the barrier layer 265. For example, after forming the opening 260, the photoresist pattern 250 may be removed by an ashing process and/or a strip process.

In example embodiments, a cleaning process may be further performed to remove an etching residue including, e.g., a metal which may remain on the insulating interlayer 225.

Figure 14:
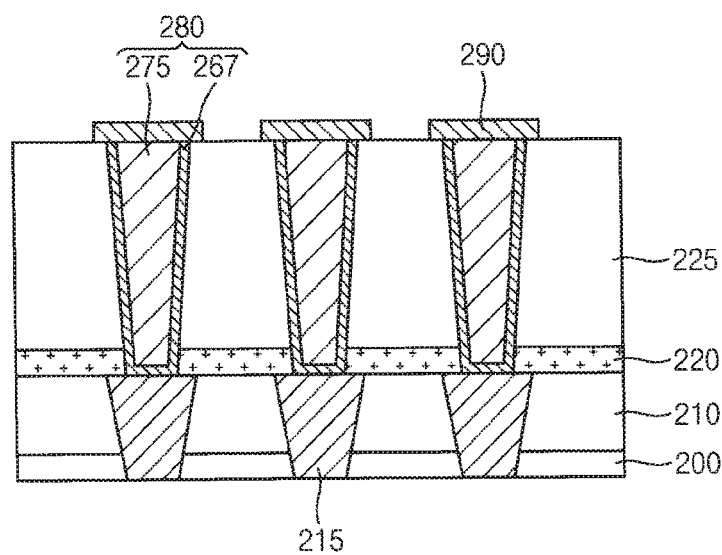

Referring to FIG. 14, a capping layer pattern 290 may be formed on an upper surface of the conductive pattern 280.

For example, a capping layer covering the conductive patterns 280 may be formed on the insulating interlayer 225, and the capping layer may be partially etched to form the capping layer pattern 290 which may cover the conductive pattern 280.

The capping layer may be formed of a metal that may be more chemically stable than a metal included in the conductive pattern 280 by a sputtering process or an ALD process. For example, the capping layer may be formed using a metal such as aluminum, cobalt or molybdenum. In example embodiments, the capping layer may be formed of a nitride of the metal.

The capping layer may be patterned by a wet etching process using an etchant solution that may include peroxide such as hydrogen peroxide. In example embodiments, the capping layer may be self-aligned with the conductive pattern 280 by an affinity between metallic materials. In this case, the capping layer pattern 290 may be formed without an additional patterning process.

In example embodiments, a build-up process may be further performed such that additional insulating interlayer, conductive pattern and/or upper wiring may be formed on the insulating interlayer 225 and the capping layer pattern 290. In this case, the conductive pattern 280 may serve as an interconnection structure electrically connecting the lower contact 215 and the upper wiring to each other. In example embodiments, the conductive pattern 280 may serve as a wiring extending linearly, and may be electrically connected to the plurality of the lower contacts 215.

As described above, the opening 260 for the formation of the conductive pattern 280 may be formed using the photoresist polymer or the photoresist composition according to example embodiments.

As a width of the conductive pattern 280 and a distance between the conductive patterns 280 become decreased, a photolithography process having a high resolution may be needed. In example embodiments, an exposure process may be performed only through a photochemical reaction between the active fluorine and the silicon-containing leaving group. Thus, an irregular acid diffusion occurring in a CAR system-based photolithography process may be avoided. Therefore, the conductive pattern having a fine pitch and a fine dimension may be formed as a desired uniform profile, and a resolution of the photolithography process may be improved.

Additionally, in the CAR system-based photolithography process, a photoresist layer may be formed to have a thickness greater than a target thickness of a photoresist pattern in consideration of a damage of the photoresist layer by the acid diffusion. However, in example embodiments, a photolithography process substantially free of the acid diffusion may be realized. Thus, a thickness of the photoresist layer may be reduced because a thickness tolerance may not be needed, and further a process cost may be also reduced.

Methods of Manufacturing Semiconductor Devices

FIGS. 15 to 33 are top plan views and cross-sectional views illustrating a method of manufacturing a semiconductor device in accordance with example embodiments.

Figure 23:
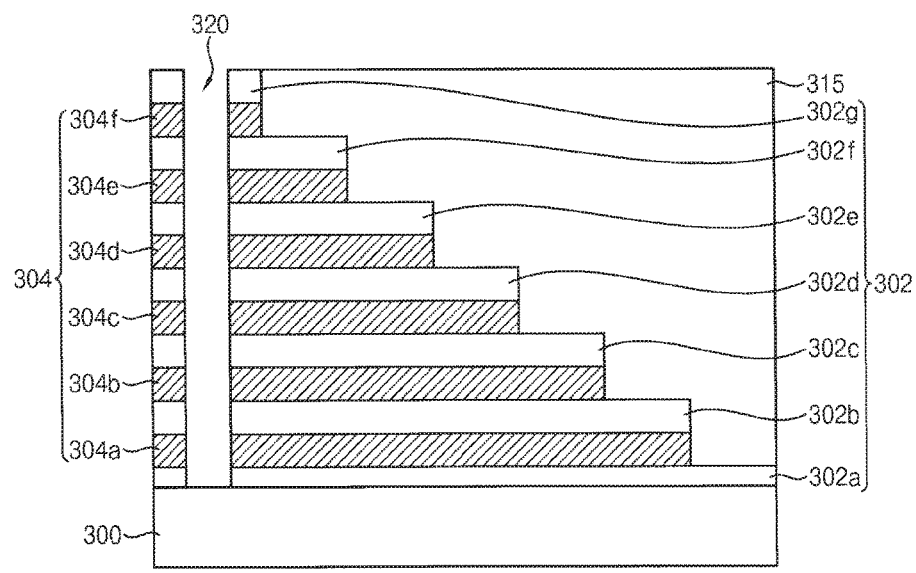
Figure 23:
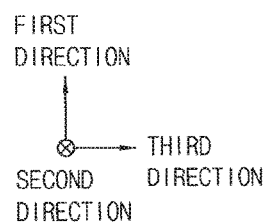
Figure 24:
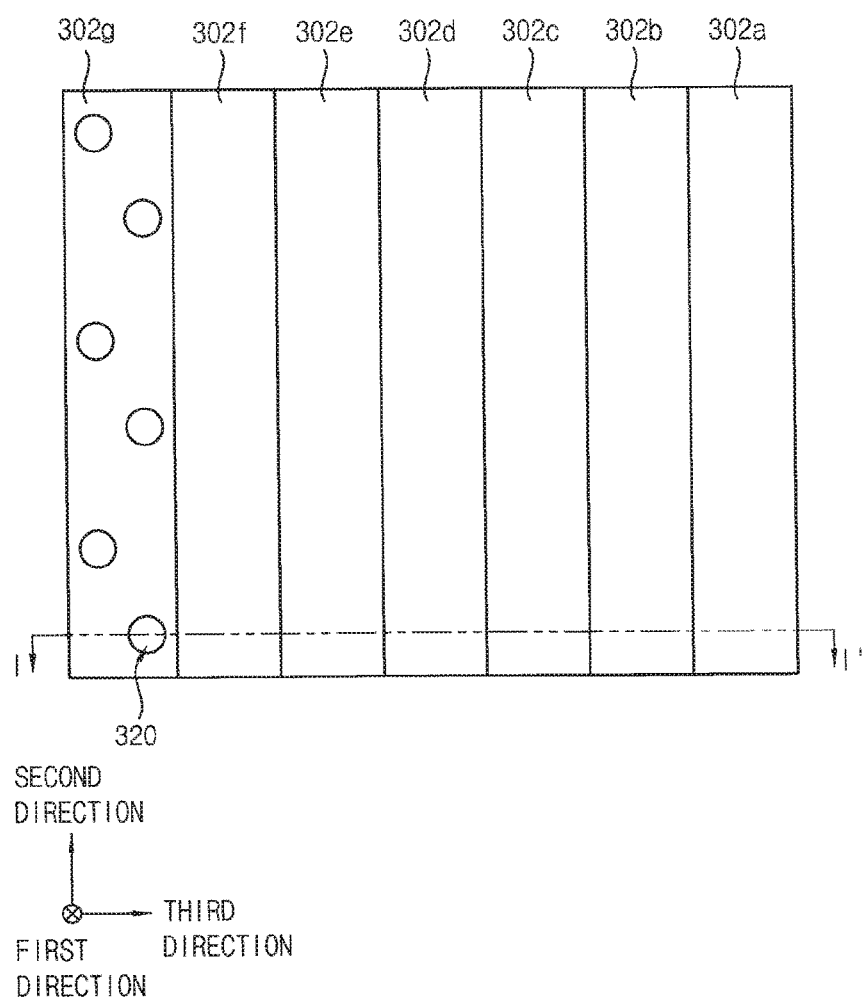
Figure 26:
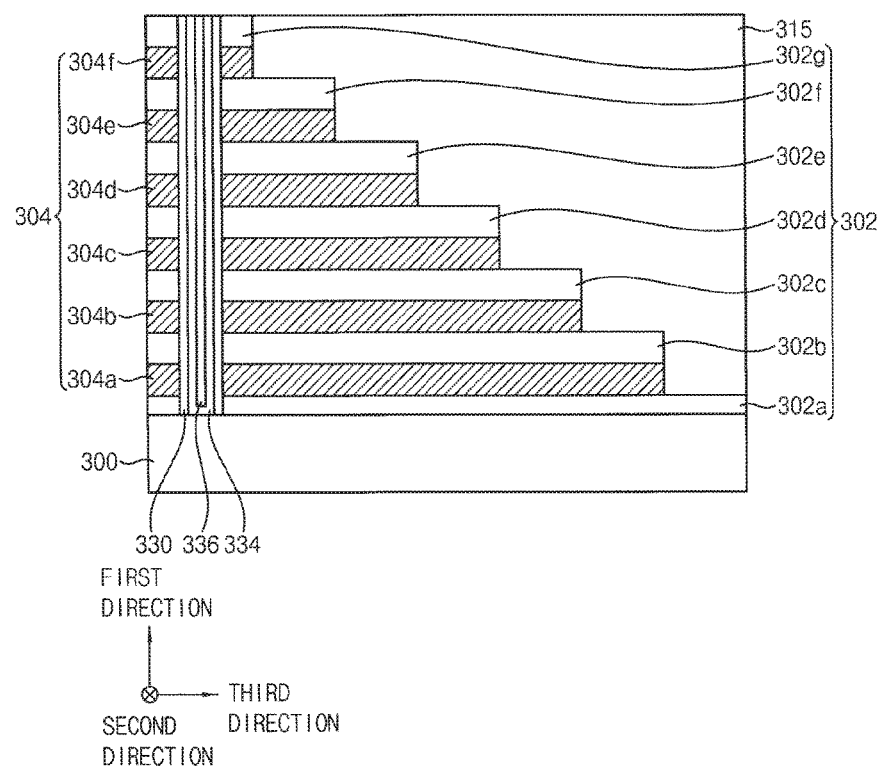
Figure 27:
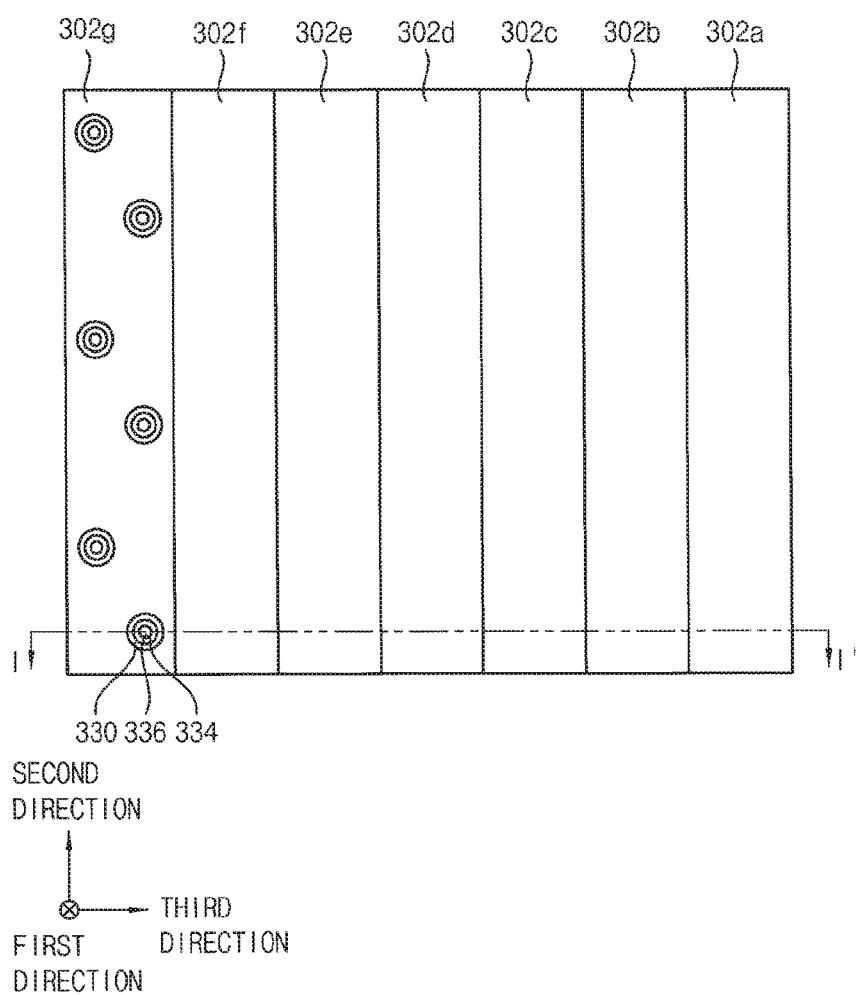
Figure 28:
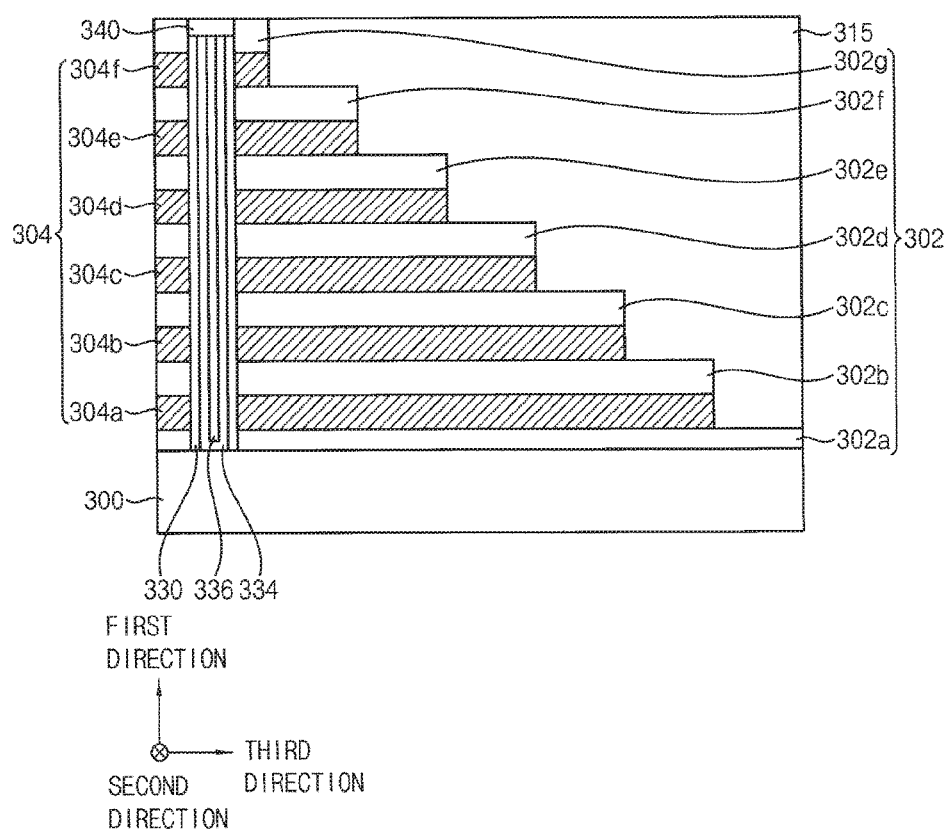
Figure 29:
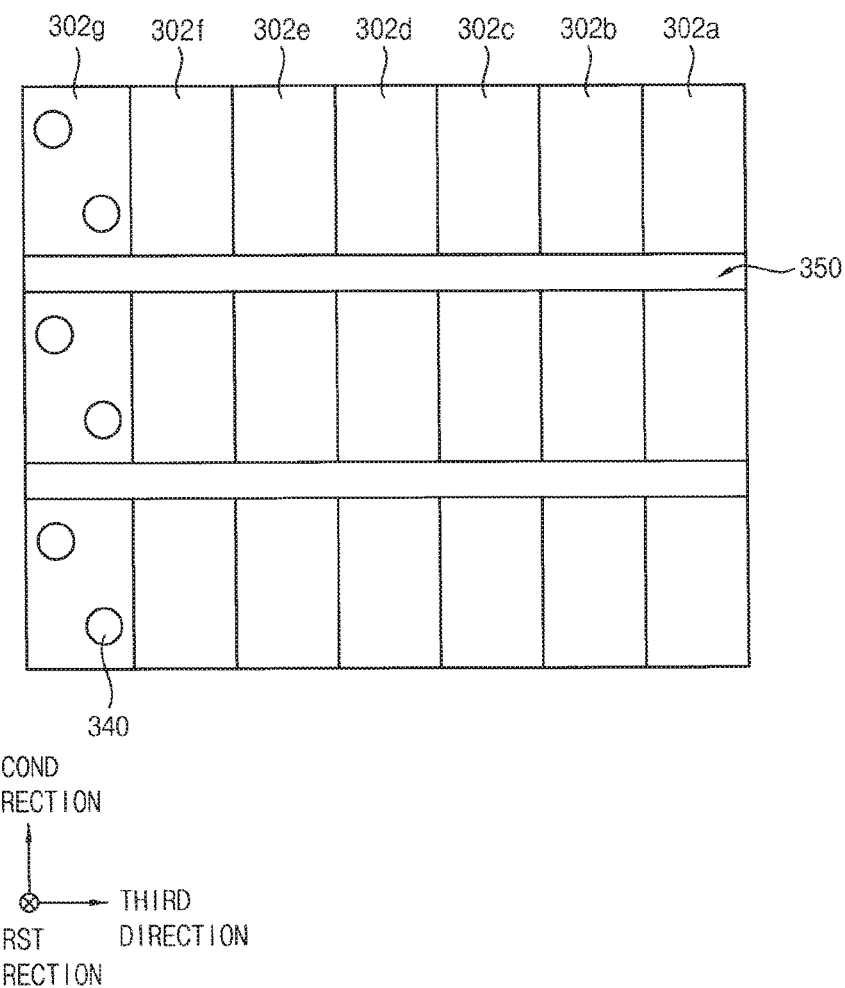

Specifically, FIGS. 24, 27 and 29 are top plan views illustrating the method. FIGS. 15 to 23, 25, 26, 28, and 30 to 33 are cross-sectional views taken along a line I-I' indicated in FIGS. 24 and 27.

For example, FIGS. 15 to 33 illustrate a method of manufacturing a vertical memory device including a channel extending vertically to a top surface of a substrate.

In FIGS. 15 to 33, a direction substantially vertical to the top surface of the substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as the same direction.

In example embodiments, the vertical memory device manufactured by the method of FIGS. 15 to 33 may be a nonvolatile memory. The nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer. Each vertical NAND string may further include at least one select transistor located over memory cells. The at least one select transistor may have the same structure with the memory cells and may be formed monolithically together with the memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654, 587; 8,559,235; and US Pat. Pub. No. 2011/0233648.

Figure 15:
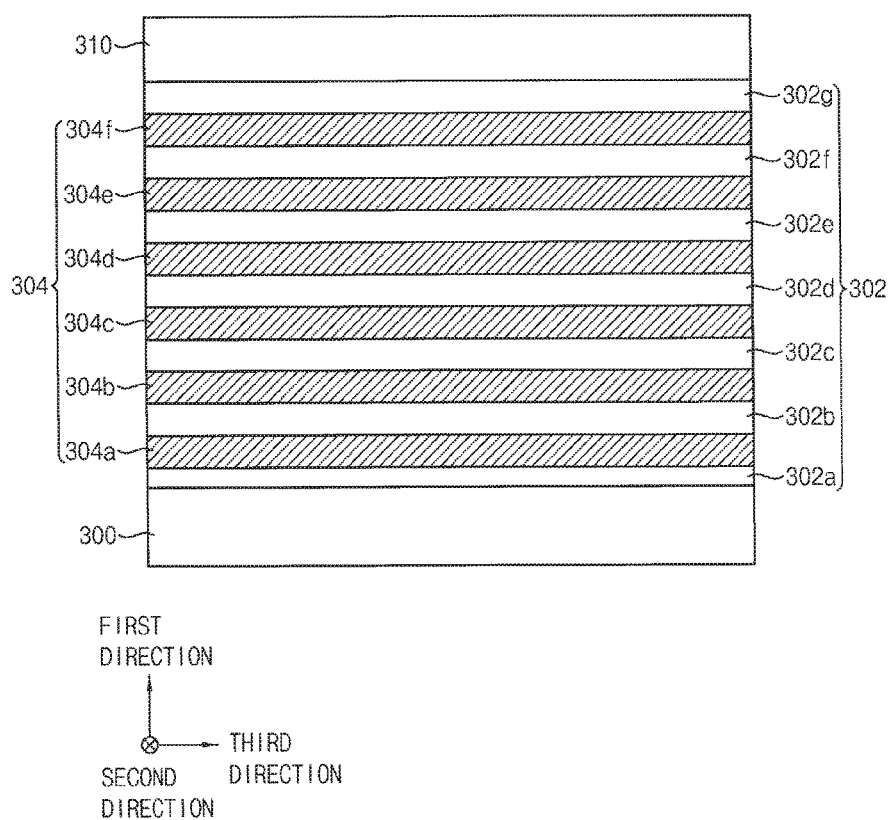

Referring to FIG. 15, insulating interlayers 302 (e.g., 302a to 302g) and sacrificial layers 304 (e.g., 304a to 304f) may be alternately and repeatedly formed on a substrate 300 to form a mold structure. A photoresist layer 310 may be formed on the mold structure or an uppermost insulating interlayer 302g.

The substrate 300 may include a semiconductor material such as silicon, germanium, silicon-germanium, or the like. Alternatively, the substrate may include a semiconductor-on-insulator material (e.g., silicon on insulator).

In example embodiments, the insulating interlayer 302 may be formed of an oxide-based material, e.g., silicon dioxide, silicon carboxide and/or silicon fluorooxide. The sacrificial layer 304 may be formed using a material that may have an etching selectivity with respect to the insulating interlayer 302 and may be easily removed by a wet etching process. For example, the sacrificial layer 304 may be formed of a nitride-based material, e.g., silicon nitride and/or silicon boronitride.

The insulating interlayer 302 and the sacrificial layer 304 may be formed by a CVD process, a PECVD process, a spin coating process, etc. A lowermost insulating interlayer 302a may be formed by a thermal oxidation process on the top surface of the substrate 300. In this case, the lowermost insulating interlayer 302a may have a thin thickness relatively to other insulating interlayers 302b through 302g.

The sacrificial layers 304 may be removed in a subsequent process to provide spaces for a ground selection line (GSL), a word line and a string selection line (SSL). Thus, the number of the insulating interlayers 302 and the sacrificial layers 304 may be adjusted in consideration of the number of the GSL, the word line and the SSL. For example, each of the GSL and the SSL may be formed at a single level, and the word line may be formed at 4 levels. Accordingly, the sacrificial layers 304 may be formed at 6 levels, and the insulating interlayers 302 may be formed at 7 levels as illustrated in FIG. 15. However, the number of the GSL, the SSL and the word line may not be limited to the examples provided herein, and may be properly adjusted in consideration of a degree of integration and a circuit design of the semiconductor device.

The photoresist layer 310 may be formed using the photoresist composition according to example embodiments. As described above, the photoresist composition may include a photoresist polymer that may include a repeating unit to which a silicon-containing leaving group may be combined, a fluorine-containing source providing an active fluorine, and a solvent. The photoresist composition may optionally include a surfactant, a PAG and/or a sensitizer.

In example embodiments, the fluorine-containing source may be incorporated in the photoresist polymer. In this case, the photoresist polymer may be a polymer from a first repeating unit including a fluorine leaving group, and a second repeating unit including the silicon-containing leaving group.

In example embodiments, the photoresist polymer may be represented by the above Chemical Formula 2 or Chemical Formula 3.

In example embodiments, the fluorine-containing source may be provided as an organic salt solution or an inorganic salt solution of a fluorine ion.

The photoresist composition may be coated to form a preliminary photoresist layer, and the preliminary photoresist layer may be cured by, e.g., a baking process to form the photoresist layer 310. In example embodiments, an anti-reflective layer may be further formed before the formation of the photoresist layer 310.

Figure 16:
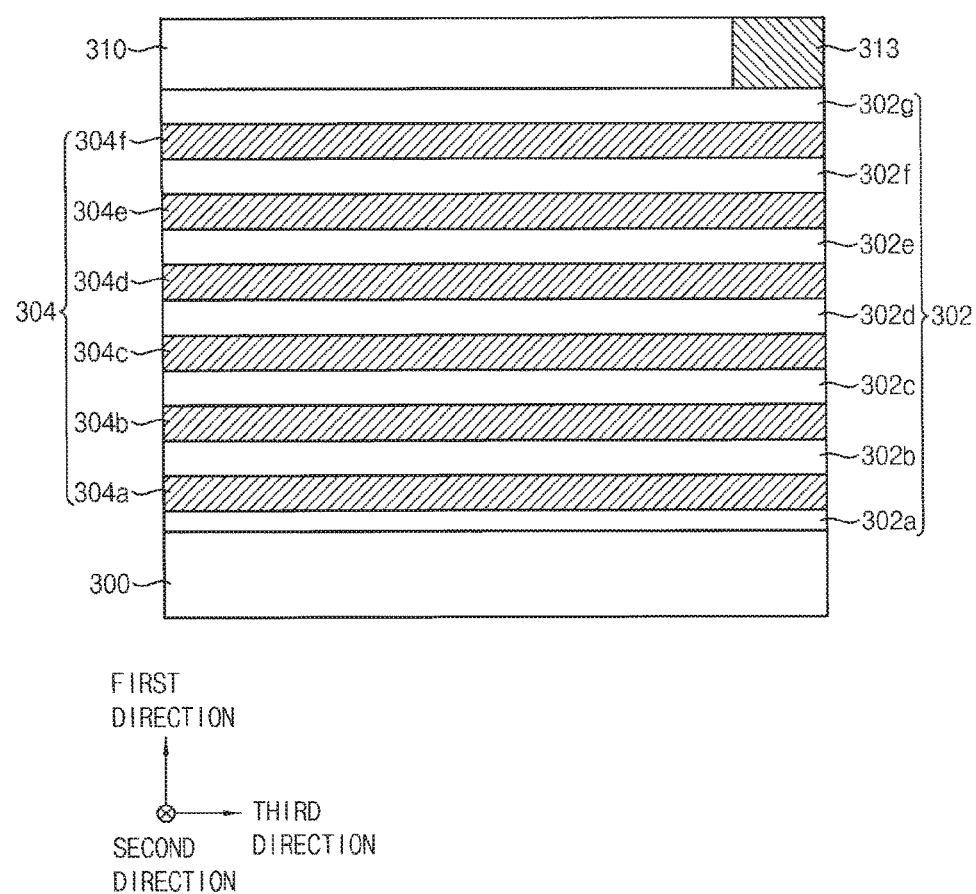

Referring to FIG. 16, a process substantially the same as or similar to that illustrated with reference to FIG. 3 may be performed.

In example embodiments, an exposure mask exposing a lateral portion or an end portion of the photoresist layer 310 may be placed on the photoresist layer 310, and an exposure process may be performed. Accordingly, the lateral portion and the end portion of the photoresist layer 310 may be converted into an exposed portion 313 having an increased hydrophilicity and/or polarity by a photo-chemical reaction.

As described above, the active fluorine including a fluorine ion or a fluorine radical may be generated from the fluorine-containing source included in the exposed portion 313. The active fluorine may be transferred to the silicon-containing leaving group. Accordingly, the photo-chemical reaction between the first and second repeating units may be induced by, e.g., a mechanism as shown in Reaction Scheme 1, so that the hydrophilicity and/or polarity of the exposed portion 313 may be remarkably increased relatively to a non-exposed portion.

Figure 17:
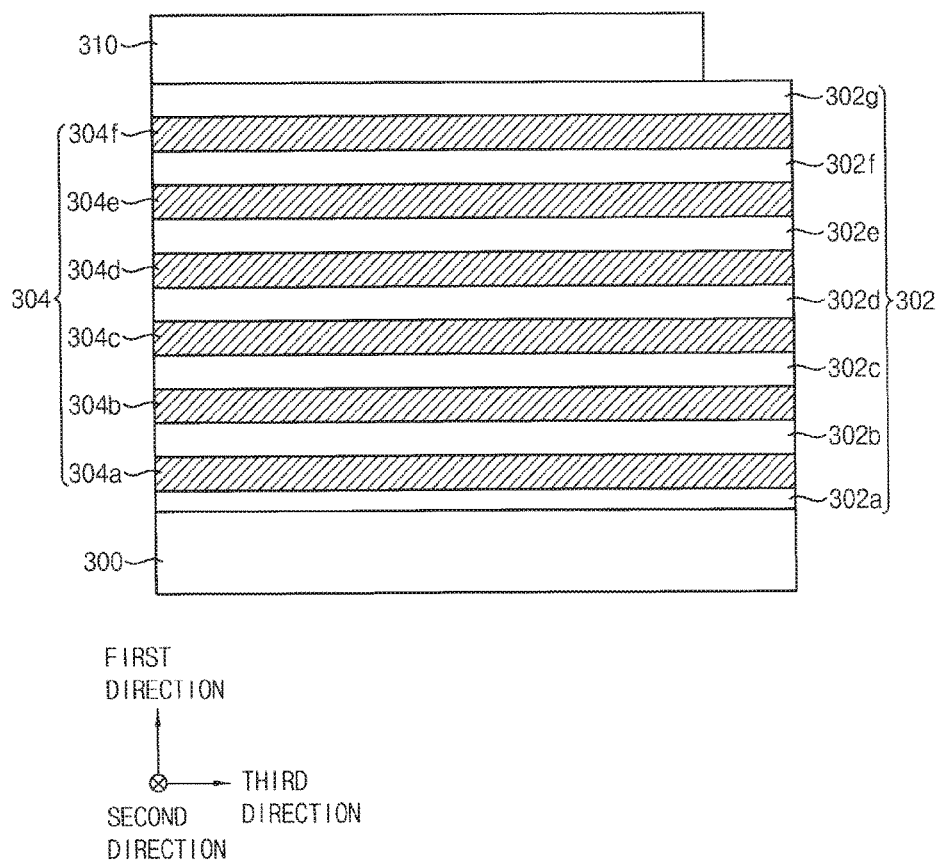

Referring to FIG. 17, a process substantially the same as or similar to that illustrated with reference to FIG. 4 may be performed to remove the exposed portion 313.

In example embodiments, the exposed portion 313 may be selectively removed by a developing process or a dry etching process.

Figure 18:
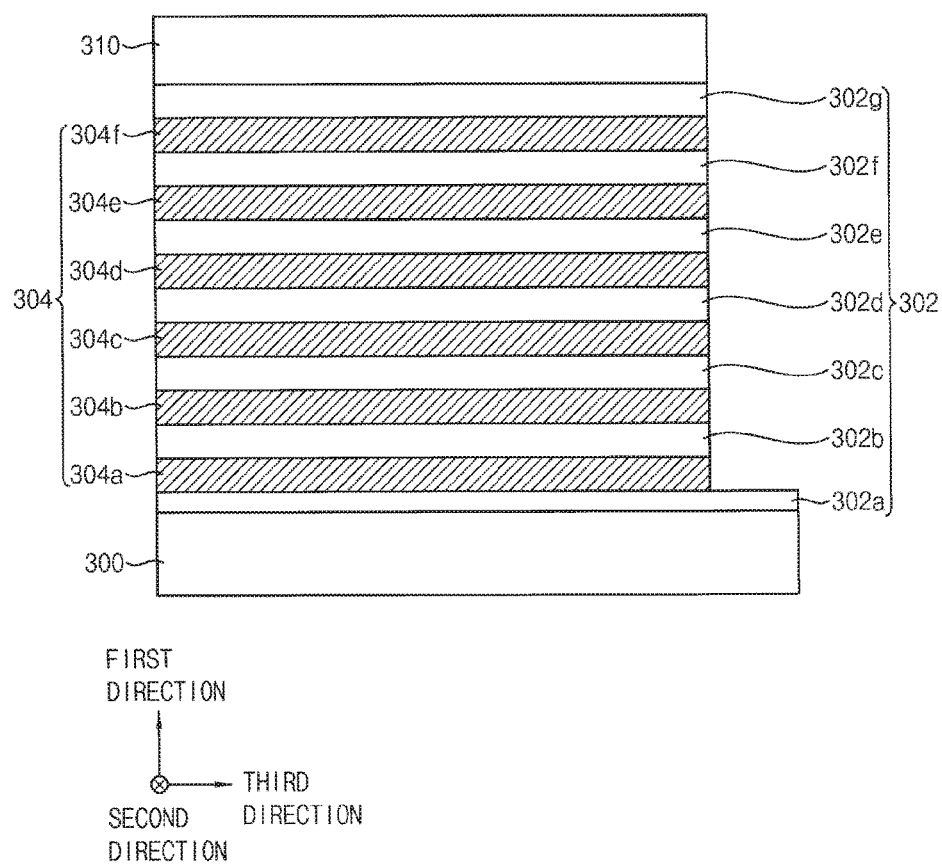

Referring to FIG. 18, lateral portions or end portions of the insulating interlayers 302b to 302g, and the sacrificial layers 304a to 304f may be etched using the photoresist layer 310 having a reduced width as an etching mask.

Figure 19:
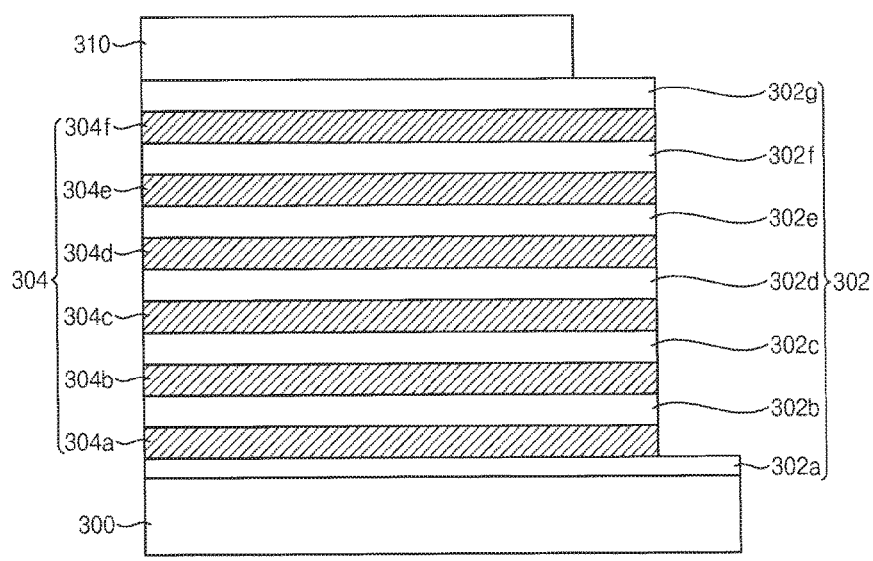
Figure 19:
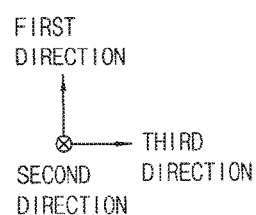

Referring to FIG. 19, processes substantially the same as or similar to those illustrated with reference to FIGS. 16 and 17 may be repeated. Accordingly, a lateral portion or an end portion of the remaining photoresist layer 310 may be removed, such that a width of the photoresist layer 310 may be reduced again.

Figure 20:
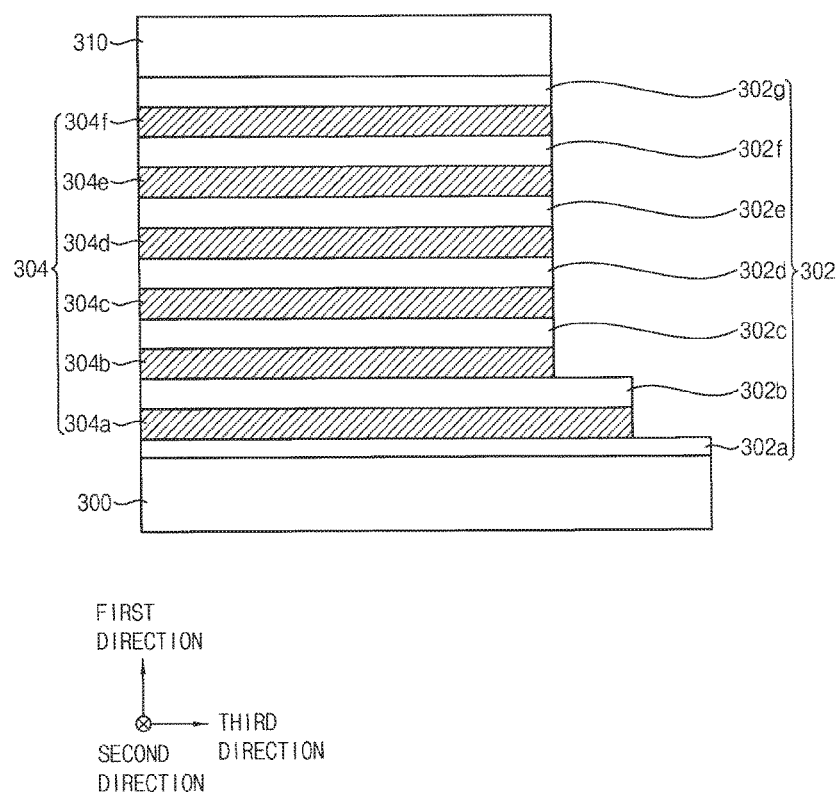

Referring to FIG. 20, lateral portions or end portions of the insulating interlayers 302c to 302g, and the sacrificial layers 304b to 304f may be etched using the photoresist layer 310 having the reduced width as an etching mask.

Figure 21:
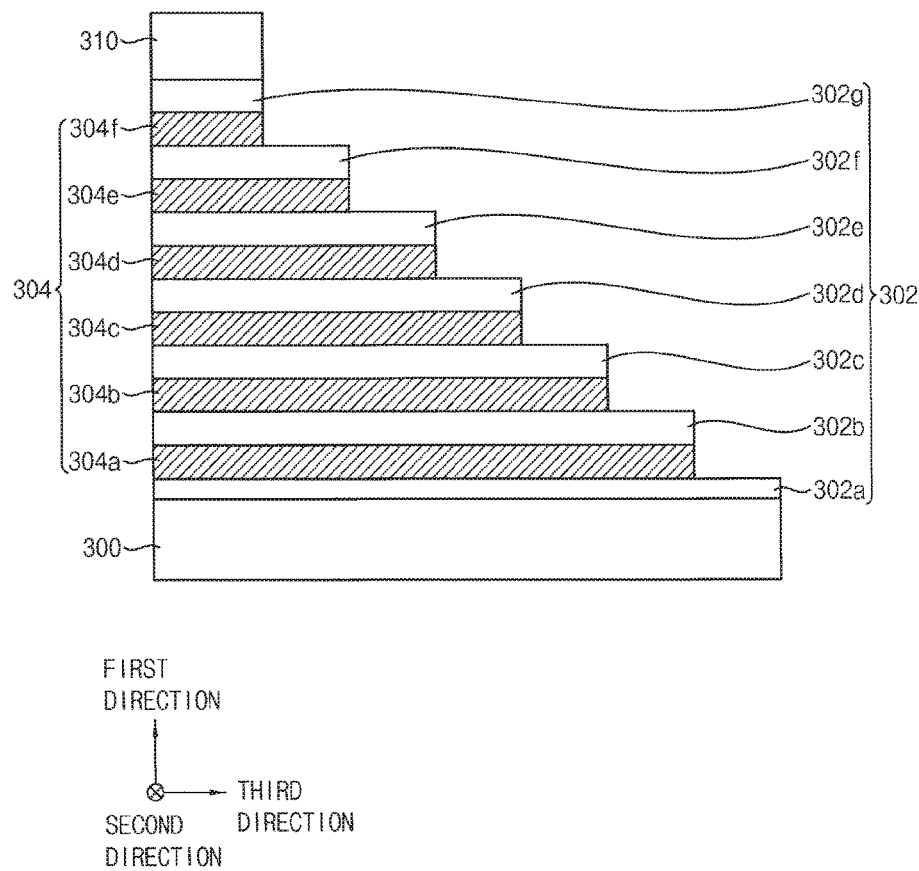

Referring to FIG. 21, processes substantially similar to those illustrated with reference to FIGS. 19 and 20 may be repeated. For example, a reduction of width of the photoresist layer 310, and etching processes of the insulating interlayers 302 and the sacrificial layers 304 may be repeated to form a stepped mold structure including a plurality of steps or stairs.

As described above, a plurality of exposure processes may be repeated on the photoresist layer 310 for the formation of the stepped mold structure. As the exposure processes are repeatedly performed, a thickness of the photoresist layer 310 may be gradually decreased. For example, in the above-mentioned CAR system-based photolithography process, the photoresist layer 310 may be excessively damaged by an acid diffusion before the formation of the stepped mold structure.

However, according to example embodiments, the exposed portion 313 having the increased hydrophilicity and/or polarity relative to a remaining portion of the photoresist layer 310 may be formed by the photo-chemical reaction between the active fluorine and the silicon-containing leaving group without an involvement of an acid. The exposed portion 313 may be selectively removed by the developing process or the dry etching process without damaging the non-exposed photoresist layer 310.

Therefore, even though the exposure processes may be repeatedly performed, durability and stability of the photoresist layer 310 may be maintained, and a target thickness of the photoresist layer 310 may be decreased.

The remaining photoresist layer 310 after the formation of the stepped mold structure may be removed by an ashing process and/or a strip process.

The photolithography process for the formation of the stepped mold structure may be concurrently performed at both lateral portions of the mold structure. In this case, the stepped mold structure may have a substantially pyramidal shape.

Figure 22:
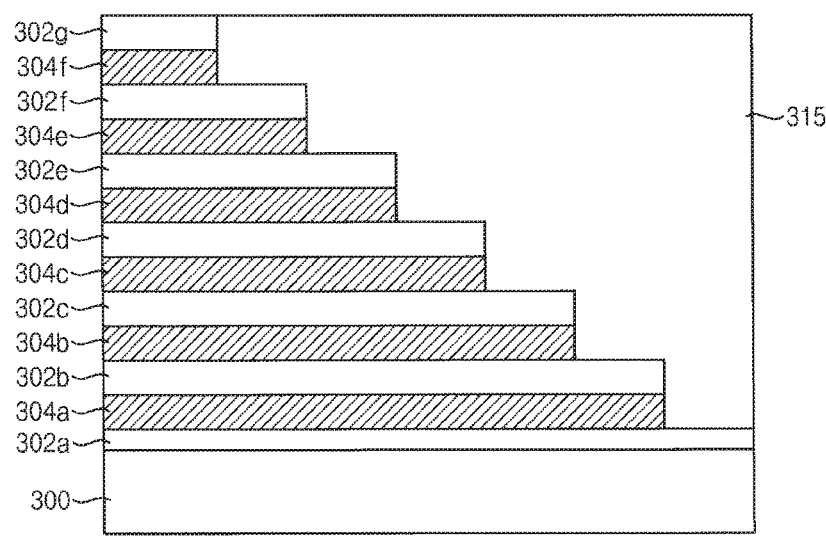
Figure 22:
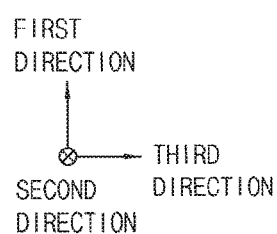

Referring to FIG. 22, a mold protection layer 315 covering a lateral surface of the stepped mold structure may be formed.

For example, an insulation layer covering the stepped mold structure may be formed on the substrate 300 using, e.g., silicon oxide by a CVD process or a spin coating process. An upper portion of the insulation layer may be planarized by a CMP process until the uppermost insulating interlayer 302g is exposed to form the mold protection layer 315.

Referring to FIGS. 23 and 24, a plurality of channel holes 320 may be formed through the insulating interlayers 302 and the sacrificial layers 304. For example, a hard mask (not illustrated) may be formed on the uppermost insulating interlayer 302g and the mold protection layer 315. The insulating interlayers 302 and the sacrificial layers 304 may be partially etched by, e.g., a dry etching process. The hard mask may be used as an etching mask to form the channel hole 320. A top surface of the substrate 300 may be partially exposed by the channel hole 320.

The hard mask may be formed of silicon-based or carbon-based spin-on hardmask (SOH) materials, or polysilicon. After the formation of the channel hole 320, the hard mask may be removed by an ashing process and/or strip process.

In example embodiments, the channel hole 320 may be formed by the methods of forming patterns utilizing the photoresist polymer or the photoresist composition in accordance with example embodiments.

For example, a photoresist layer may be formed on the uppermost insulating interlayer 302g and the mold protection layer 315 as described with reference to FIG. 2. A portion of the photoresist layer overlapping a region for the channel hole 320 may be converted to an exposed portion having an increased hydrophiliciy and/or polarity as described with reference to FIG. 3. As described with reference to FIG. 4, the exposed portion may be removed to form a photoresist pattern, the insulating interlayers 302 and the sacrificial layers 304 may be partially etched using the photoresist pattern as an etching mask to form the channel hole 320.

In example embodiments, the channel hole 320 may extend in the first direction, and a plurality of the channel holes 320 may be formed along the third direction to form a channel hole row. A plurality of the channel hole rows may be formed along the second direction.

Figure 25:
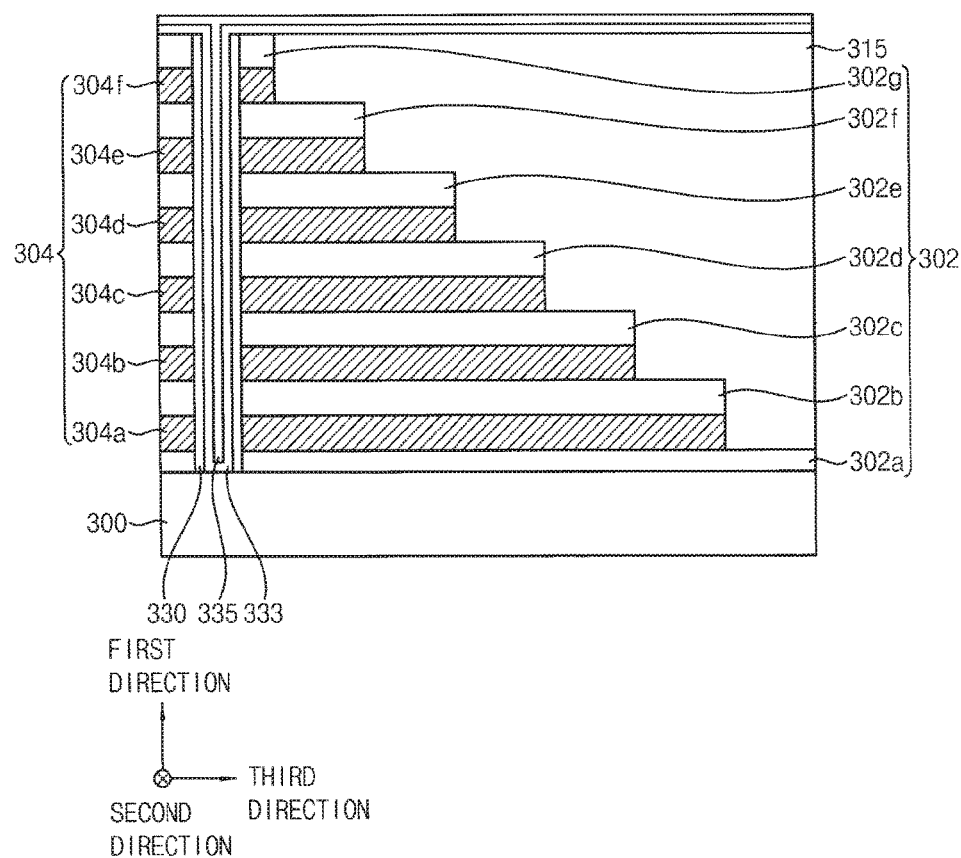

Referring to FIG. 25, a dielectric layer structure 330 may be formed on a sidewall of the channel hole 320, and a channel layer 333 and a first filling layer 335 filling the channel hole 320 may be formed on the dielectric layer structure 330.

In example embodiments, a dielectric layer may be formed along top surfaces of the uppermost insulating interlayer 302g and the mold protection layer 315, and the sidewalls and bottoms of the channel holes 320. Portions of the dielectric layer formed on the top surfaces of the uppermost insulating interlayer 302g and the mold protection layer 315, and the bottoms of the channel holes 320 may be removed by an etch-back process. Accordingly, the dielectric layer structure 330 having, e.g., a straw shape may be formed in the sidewall of each channel hole 320.

In example embodiments, the dielectric layer may include a blocking layer, a charge storage layer and a tunnel insulation layer sequentially stacked from the sidewall of the channel hole 320. For example, the dielectric layer may have an oxide-nitride-oxide (ONO) layered structure.

A channel layer 333 may be formed conformally on the uppermost insulating interlayer 302g, a top surface and an inner sidewall of the dielectric layer structure 330, and the top surface of the substrate 300 exposed through the channel hole 320. The first filling layer 335 sufficiently filling a remaining portion of the channel hole 320 may be formed on the channel layer 333.

The channel layer 333 may be formed using polysilicon or amorphous silicon which is optionally doped with impurities. In example embodiments, a heat treatment or a laser beam irradiation may be further performed on the channel layer 333. In this case, the channel layer 333 may include single crystalline silicon. The first filling layer 335 may be formed using an insulative material, e.g., silicon oxide.

Referring to FIGS. 26 and 27, upper portions of the first filling layer 335 and the channel layer 333 may be planarized by, e.g., a CMP process until the uppermost insulating interlayer 302g is exposed.

Accordingly, a channel 334 and a first filling layer pattern 336 surround by the dielectric layer structure 330 may be formed in the channel hole 310. The channel 334 may have a cup shape, and a lower portion of the channel 334 may be in contact with the top surface of the substrate 300. The first filling layer pattern 336 may have a pillar shape accommodated in the channel 334.

In example embodiments, after the formation of the channel hole 320 and before the formation of the dielectric layer structure 330, a semiconductor pattern may be further formed at a lower portion of the channel hole 320. The semiconductor pattern may be formed by a selective epitaxial growth (SEG) process using the top surface of the substrate 300 as a seed. In this case, the dielectric layer structure 330 and the channel 334 may be formed on a top surface of the semiconductor pattern.

After the formation of the channel 334 in each of the channel holes 320, a channel row comparable to the channel hole row may be defined, and a plurality of the channel rows may be arranged along the second direction.

Referring to FIG. 28, a pad 340 filling an upper portion of the channel hole 330 may be formed.

For example, upper portions of the dielectric layer structure 330, the channel 334 and the first filling layer pattern 336 may be partially removed by, e.g., an etch-back process to form a recess. A pad layer may be formed on the uppermost insulating interlayer 302g and the mold protection layer 315 to sufficiently fill the recess. An upper portion of the pad layer may be planarized until a top surface of the uppermost insulating interlayer 302g is exposed to form the pad 340 from a remaining portion of the pad layer. In example embodiments, the pad layer may be formed using polysilicon optionally doped with n-type impurities. In example embodiments, a preliminary pad layer including amorphous silicon may be formed, and then a crystallization process may be performed thereon to form the pad layer.

Referring to FIG. 29, the stepped mold structure and the mold protection layer 315 may be partially etched to form an opening 350.

For example, a hard mask (not illustrated) covering the pads 340 and partially exposing the uppermost insulating interlayer 302g and the mold protection layer 315 between some of the channel rows may be formed. The mold protection layer 315, the insulating interlayers 302 and the sacrificial layers 304 may be partially etched by, e.g., a dry etching process using the hard mask as an etching mask to form the opening 350. The hard mask may be formed using a photoresist material or an SOH material. The hard mask may be removed by an ashing process and/or a strip process after the formation of the opening 350.

The opening 350 may extend in the third direction, and a plurality of the openings 350 may be formed along the second direction by a desired (and/or alternatively predetermined) distance. For example, the desired (and/or alternatively predetermined) number of the channel rows may be included between the openings 350 neighboring in the second direction.

The opening 350 may also extend through the stepped mold structure in the first direction. The top surface of the substrate 300 may be exposed through a bottom of the opening 350, and the insulating interlayers 302 and the sacrificial layers 304 may be exposed through a sidewall of the opening 350.

Figure 30:
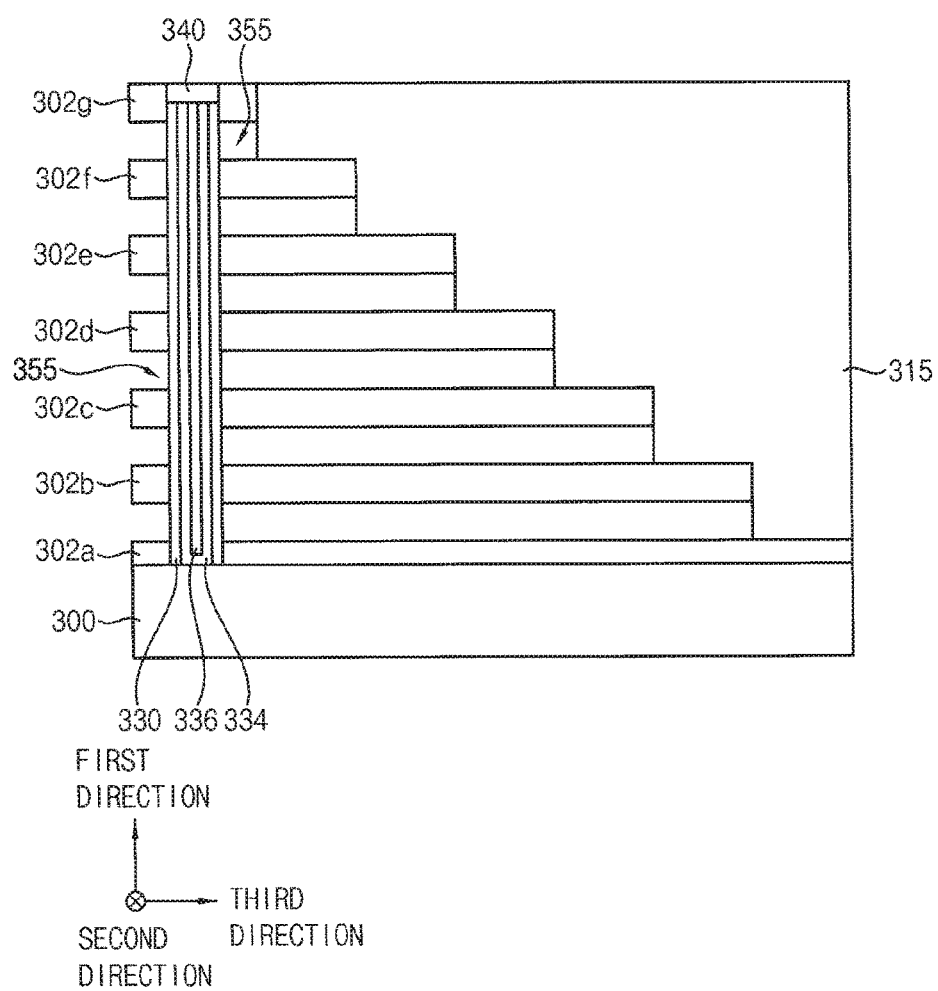

Referring to FIG. 30, the sacrificial layers 304 which are exposed by the sidewall of the opening 350 may be removed.

In example embodiments, if the sacrificial layer 304 includes silicon nitride, and the insulating interlayer 302 includes silicon oxide, the sacrificial layers 304 may be removed by a wet etching process using, e.g., phosphoric acid that may have an etching selectivity for silicon nitride as an etchant solution.

A gap 355 may be defined by a space from which the sacrificial layer 304 is removed. A plurality of the gaps 355 may be formed along the first direction. An outer sidewall of the dielectric layer structure 330 may be at least partially exposed by the gap 355.

Figure 31:
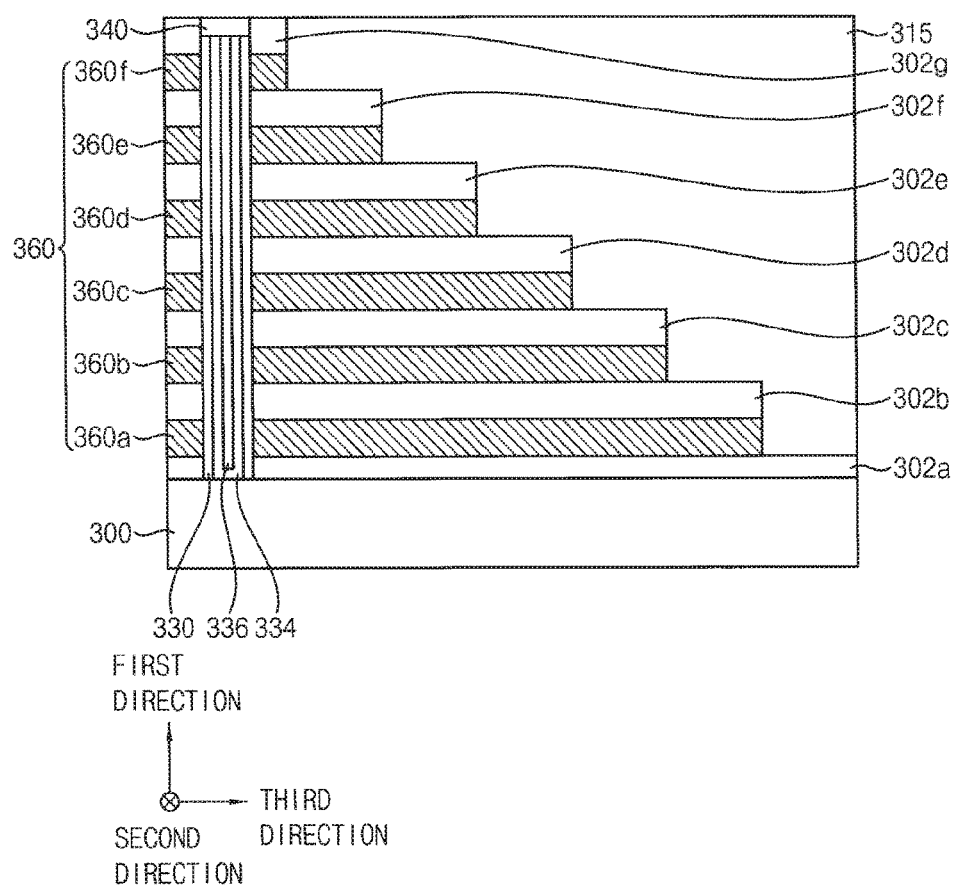

Referring to FIG. 31, a gate line 360 may be formed in the gap 355 at each level.

For example, a gate electrode layer may be formed along the exposed outer sidewall of the dielectric layer structure 330, surfaces of the insulating interlayers 302, top surfaces of the mold protection layer 315 and the pad 340, and the top surface of the substrate 300 exposed through the opening 350. The gate electrode layer may sufficiently fill the gaps 355, and may partially fill the opening 350.

The gate electrode layer may be formed using a metal or a metal nitride having low electrical resistance and work function. For example, the gate electrode layer may be formed using tungsten, tungsten nitride, titanium, titanium nitride, tantalum, tantalum nitride, platinum, etc. The gate electrode layer may be formed by a CVD process, a PECVD process, an ALD process, a PVD process, a sputtering process, etc.

The gate electrode layer may be partially etched to form the gate line 360 in the gap 355 at the each level.

For example, an upper portion of the gate electrode layer may be planarized by a CMP process until the uppermost insulating interlayer 302g or the mold protection layer 315 is exposed. Portions of the gate electrode layer formed in the opening 350 and on the top surface of the substrate 300 may be etched to obtain the gate lines 360 (e.g., 360a to 360f). The gate electrode layer may be partially etched by a wet etching process using, e.g., a hydrogen peroxide-containing solution.

The gate lines 360 may include the GSL, the word line and the SSL sequentially stacked and spaced apart from one another in the first direction. For example, a lowermost gate line 360a may serve as the GSL. Four gate lines 360b to 360e on the GSL may serve as the word lines. An uppermost gate line 360f on the word line may serve as the SSL. However, the stacked number of the GSL, the word line and the SSL may be properly adjusted in consideration of a circuit design and/or a degree of integration of the vertical memory device.

The gate line 360 at the each level may surround the channel rows between the openings 350 neighboring in the second direction, and may extend in the third direction. The gate lines 360 may be stacked in the first direction to form a stepped structure. Accordingly, the gate line 360 may include an extended portion protruding in the third direction.

After the formation of the gate lines 360, e.g., n-type impurities may be implanted through the top surface of the substrate 300 exposed through the opening 350 to form an impurity region (not illustrated). For example, the impurity region may serve as a common source line (CSL) extending in the third direction.

A second filling layer (not illustrated) filling the opening 350 may be formed on the impurity region. For example, the second filling layer may be formed of silicon oxide by a CVD process.

Figure 32:
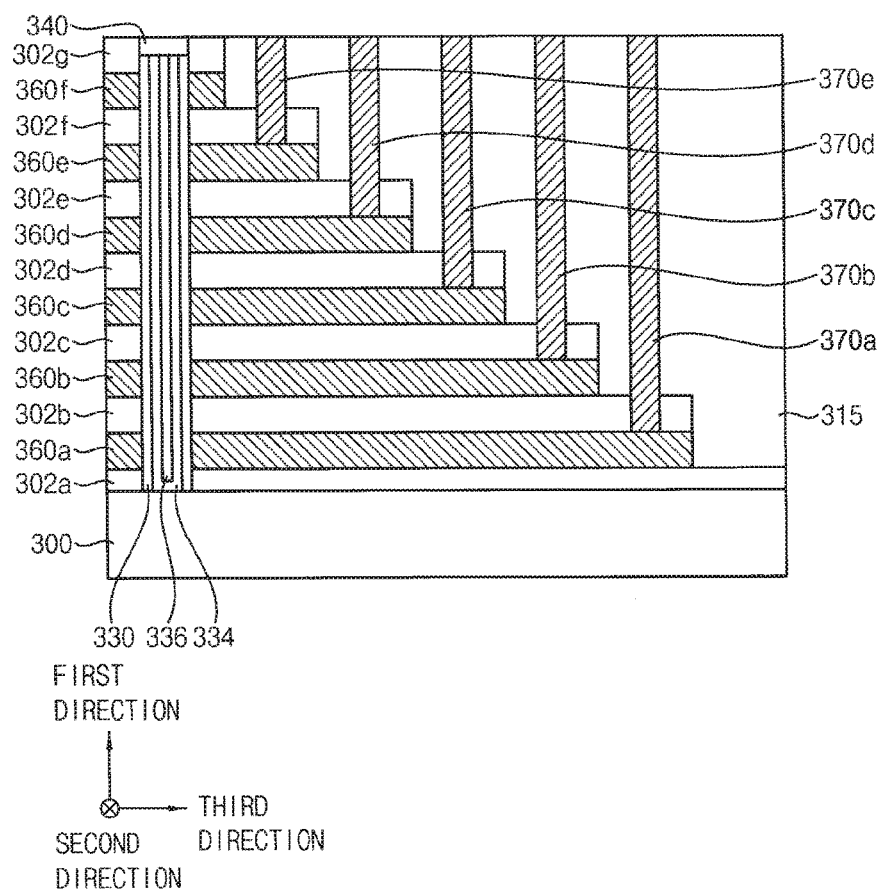

Referring to FIG. 32, first contacts 370 (e.g., 370a to 370e) electrically connected to the gate lines 360 may be formed.

In example embodiments, the mold protection layer 315 and the insulating interlayers 302 may be partially etched to form the contact holes exposing the extended portion of the gate line 360 at the each level. A first conductive layer filling the contact holes may be formed on the mold protection layer 315. An upper portion of the first conductive layer may be planarized by a CMP process until a top surface of the mold protection layer 315 is exposed to form the first contacts 370.

In example embodiments, the contact hole may be formed by the methods of forming patterns utilizing the photoresist polymer or the photoresist composition in accordance with example embodiments.

For example, a photoresist layer may be formed on the uppermost insulating interlayer 302g, the pad 340 and the mold protection layer 315 as described with reference to FIG. 2. Portions of the photoresist layer overlapping regions for the contact holes may be converted to an exposed portion having an increased hydrophiliciy and/or polarity as described with reference to FIG. 3. As described with reference to FIG. 4, the exposed portion may be removed to form a photoresist pattern. The mold protection layer 315 and the insulating interlayer 302 may be partially etched using the photoresist pattern as an etching mask to form the contact holes.

For example, some of the first contacts 370 (e.g., 370b to 370e) may be electrically connected to the gate lines 360 serving as the word lines (e.g., 360b to 360e). In this case, the extended portions of the gate lines 360b to 360e may serve as a word line pad. In example embodiments, the lowermost first contact 370a may be electrically connected to the gate line 360a serving as the GSL.

Figure 33:
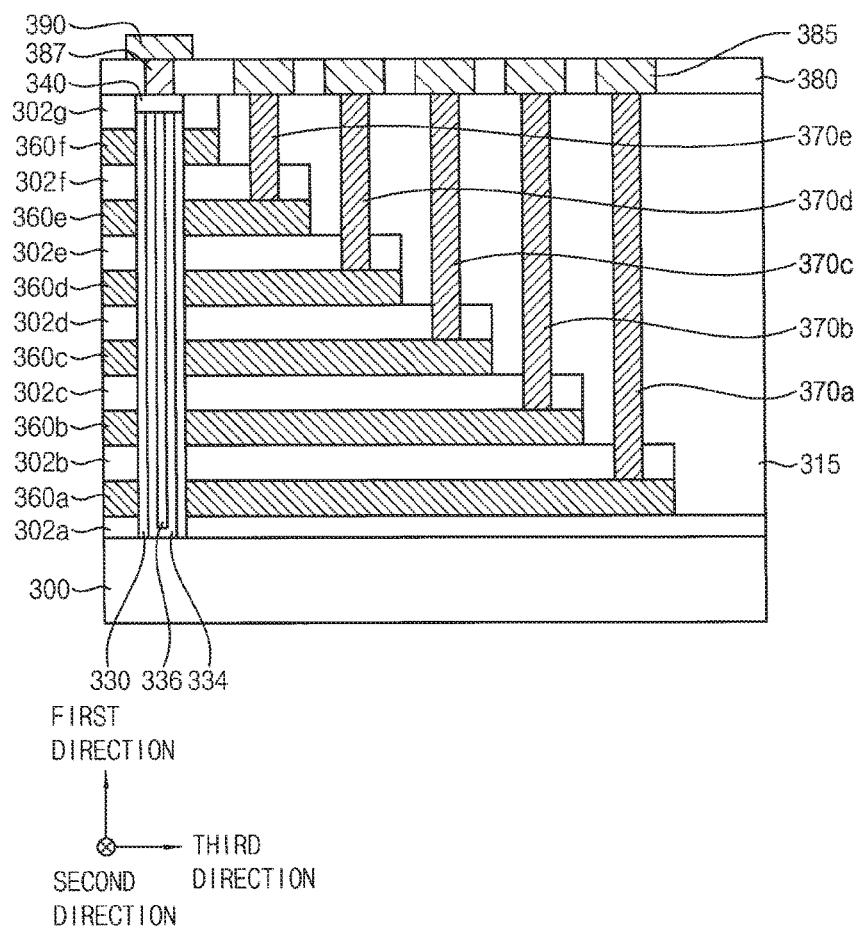

Referring to FIG. 33, an upper insulation layer 380 may be formed on the uppermost insulating interlayer 302g, the mold protection layer 315, the pad 340, the second filling layer and the first contacts 370. For example, the upper insulation layer 380 may be formed of silicon oxide by a CVD process or a spin coating process. The upper insulation layer 380 may be partially etched to form holes or openings exposing the pad 340 and the first contacts 370. A second conductive layer filling the holes or the openings may be formed on the upper insulation layer 380, and may be planarized until a top surface of the upper insulation layer 380 is exposed to form a channel contact 387 and a second contact 385.

In example embodiments, the holes and the openings may be formed by the methods of forming patterns utilizing the photoresist polymer or the photoresist composition according to example embodiments, and using the upper insulation layer 380 as an object layer.

The channel contact 387 may be in contact with the pad 340 and may be electrically connected to the channel 334. The second contact 385 may be in contact with the first contact 370.

The first and second conductive layers may be formed using a metal such as tungsten or copper, or a nitride thereof by an ALD process or a sputtering process.

In example embodiments, conductive lines electrically connected to the channel contact 387 and the second contact 385 may be formed on the upper insulation layer 380.

Some of the conductive lines may extend in, e.g., the second direction to serve as a bit line electrically connected to a plurality of the channel contacts 387. Some of the conductive lines may be electrically connected to the second contacts 385. In example embodiments, the second contact 385 may extended in the second direction, and may serve as a wiring electrically connected to a plurality of the first contacts 370.

According to example embodiments of inventive concepts, the photoresist polymer or the photoresist composition may include a fluorine-containing source and a repeating unit having a silicon-containing leaving group. For example, after forming a photoresist layer, an exposure process may be performed using a UV light source so that an active fluorine may be generated from the fluorine-containing source to remove the silicon-containing leaving group. Accordingly, the silicon-containing group may be replaced with a hydrophilic group such as a hydroxyl group or carboxylic acid. Therefore, an etching rate and a polarity of the photoresist layer may be differentiated at an exposed portion and a non-exposed portion thereof, and a photoresist pattern having a high resolution may be formed even without an assistance of a PAG.

The photoresist composition or the photoresist polymer in accordance with example embodiments may be used in a photolithography process for a formation of a fine pattern having a dimension of, e.g., about 20 nm. Wirings, contacts, insulation patterns, etc., of various semiconductor devices such as flash memory devices, DRAM or MRAM devices or a logic device may be formed by the photolithography process with high resolution and reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

While some example embodiments have been particularly shown and described, it will be understood by one of ordinary skill in the art that variations in form and detail may be made therein without departing from the spirit and scope of the claims.

What is claimed is:
1. A photoresist polymer, comprising:
a first repeating unit including a fluorine leaving group configured to be removed by a photo-chemical reaction; and a second repeating unit including a silicon-containing leaving group configured to be removed by the fluorine leaving group when the fluorine leaving group is removed from the first repeating unit, wherein the photoresist polymer is represented by Chemical Formula 2:

[Chemical Formula 2]

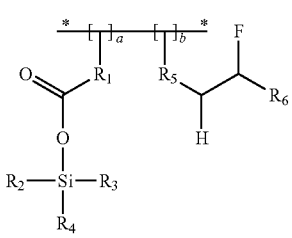

wherein, in Chemical Formula 2, $R_1$ and $R_5$ are each independently a divalent group selected from styrene, hydroxystyrene, acrylate, $C_1$-$C_6$ alkylene, arylene, carbonyl, oxy, a $C_2$-$C_{30}$ unsaturated aliphatic group, and a combination thereof, $R_2$, $R_3$ and $R_4$ are independently hydrogen, a $C_1$-$C_{20}$ alkyl group, a $C_3$-$C_{20}$ cycloalkyl group or a $C_6$-$C_{30}$ aromatic group, and $R_2$, $R_3$ and $R_4$ are the same as or different from each other, $R_6$ is a $C_1$-$C_{20}$ alkyl group, a $C_1$-$C_{20}$ allyl group, a $C_3$-$C_{20}$ cycloalkyl group, a $C_6$-$C_{30}$ aromatic group, a hydroxyl group, a hydroxyalkyl group, or a $C_1$-$C_{20}$ alkoxy group, and each a and b represents a mole ratio ranging from about 0.4 to about 0.6, and a sum of a and b is 1, wherein, in Chemical Formula 2, fluorine (F) and hydrogen (H) are positioned in a staggered conformation or an anti-periplanar configuration.

2. The photoresist polymer of claim 1, wherein the silicon-containing leaving group includes at least one selected from trimethylsilyl (TMS), tert-butyldimethylsilyl (TBDMS), triisopropylsilyl (TIPS) and tert-butyldiphenylsilyl (TBDPS).

3. A photoresist composition, comprising:
a photoresist polymer including a repeating unit combined with a silicon-containing leaving group;
a solvent; and
a fluorine-containing source configured to provide an active fluorine, wherein
the fluorine-containing source includes one of ammonium fluoride, an alkali metal fluoride, or tetrabutylammonium fluoride (TBAF).

4. The photoresist composition of claim 3, wherein the repeating unit is represented by Chemical Formula 1:

[Chemical Formula 1]

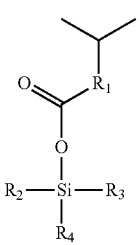

wherein, in Chemical Formula 1, $R_1$ is a divalent group selected from styrene, hydroxystyrene, acrylate, $C_1$-$C_6$ alkylene, arylene, carbonyl, oxy, a $C_2$-$C_{30}$ unsaturated aliphatic group, and a combination thereof, and $R_2$, $R_3$ and $R_4$ are independently hydrogen, a $C_1$-$C_{20}$ alkyl group, a $C_3$-$C_{20}$ cycloalkyl group or a $C_6$-$C_{30}$ aromatic group, and $R_2$, $R_3$ and $R_4$ are the same as or different from each other.

5. The photoresist composition of claim 3, wherein the fluorine-containing source includes ammonium fluoride.

6. A photoresist composition, comprising:
a photoresist polymer represented by Chemical Formula 2; and
a solvent,

[Chemical Formula 2]

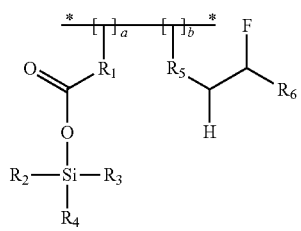

wherein, in Chemical Formula 2, $R_1$ and $R_5$ are each independently a divalent group selected from styrene, hydroxystyrene, acrylate, $C_1$-$C_6$ alkylene, arylene, carbonyl, oxy, a $C_2$-$C_{30}$ unsaturated aliphatic group, and a combination thereof, $R_2$, $R_3$ and $R_4$ are independently hydrogen, a $C_1$-$C_{20}$ alkyl group, a $C_3$-$C_{20}$ cycloalkyl group or a $C_6$-$C_{30}$ aromatic group, and $R_2$, $R_3$ and $R_4$ are the same as or different from each other, $R_6$ is a $C_1$-$C_{20}$ alkyl group, a $C_1$-$C_{20}$ allyl group, a $C_3$-$C_{20}$ cycloalkyl group, a $C_6$-$C_{30}$ aromatic group, a hydroxyl group, a hydroxyalkyl group, or a $C_1$-$C_{20}$ alkoxy group, and each a and b represents a mole ratio ranging from about 0.4 to about 0.6, and a sum of a and b is 1, wherein in Chemical Formula 2, fluorine (F) and hydrogen (H) are positioned in a staggered conformation or an anti-periplanar configuration.

7. The photoresist composition of claim 3, further comprising:
one of a photoacid generator, a sensitizer, or a combination thereof.

8. The photoresist composition of claim 7, wherein the photoacid generator includes at least one selected from the group consisting of an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine and N-hydroxysuccinimide triflate.

9. The photoresist composition of claim 7, wherein the sensitizer includes at least one selected from the group consisting of benzophenone, benzoyl, thiophene, naphthalene, anthracene, phenanthrene, pyrene, coumarin, thioxantone, acetophenone, naphtoquinone and anthraquinone.

10. The photoresist composition of claim 3, wherein the fluorine-containing source includes tetrabutylammonium fluoride (TBAF).

11. The photoresist composition of claim 3, wherein the solvent includes at least one selected from the group consisting of cyclohexanone, cyclopentanone, tetrahydrofuran (THF), dimethylformamide, propylene glycol monomethyl ether acetate (PGMEA), ethyl lactate, methyl ethyl ketone, benzene and toluene.

12. The photoresist composition of claim 3, further comprising a surfactant including at least one selected from the group consisting of a sorbitol-based agent and an alcohol.

13. The photoresist composition of claim 3, wherein the fluorine-containing source is configured to provide the active fluorine in response to an extreme ultraviolet (EUV) light.

14. The photoresist composition of claim 3, wherein
the fluorine-containing source includes the alkali metal fluoride.

15. The photoresist composition of claim 14, wherein the alkali metal fluoride includes at least one selected from the group consisting of KF, NaF and CsF.

* * * * *